(12) United States Patent
Kawahara

(10) Patent No.: US 9,281,791 B2
(45) Date of Patent: Mar. 8, 2016

(54) DEVICE FOR ADDING HARMONICS TO SOUND SIGNAL

(71) Applicant: Yamaha Corporation, Hamamatsu-shi, Shizuoka-ken (JP)

(72) Inventor: Takehiko Kawahara, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 395 days.

(21) Appl. No.: 13/893,964

(22) Filed: May 14, 2013

(65) Prior Publication Data

US 2013/0308793 A1 Nov. 21, 2013

(30) Foreign Application Priority Data

May 16, 2012 (JP) .................................. 2012-112700

(51) Int. Cl.
*H03G 5/00* (2006.01)
*H03G 3/00* (2006.01)
(Continued)

(52) U.S. Cl.
CPC ................. *H03G 3/00* (2013.01); *H03G 5/005* (2013.01); *H03G 5/025* (2013.01); *H03G 5/04* (2013.01); *H03G 5/165* (2013.01)

(58) Field of Classification Search
CPC ............. H03G 5/16; H03G 5/02; H03G 7/00; G10H 1/06; G10H 2210/281; G10H 2210/285; G10H 2210/041; G10H 1/0091; G10H 2250/111; G10H 2250/061; G10H 2250/105; G10H 2250/531; G10H 1/366; G10L 21/007; G10L 2021/02082; G10L 19/008; H04S 7/305; H04S 7/307; H04S 7/30; H04S 7/00; H04S 7/302; H04S 7/40; H04S 1/002; H04S 3/008; H04S 3/002; H04S 3/00; H04S 2420/01; H04S 2420/03; H04S 5/005; G10K 15/12; G10K 15/08; H04R 3/04; H04R 5/04; H04R 2227/007
USPC ........... 381/61, 62, 63, 22, 23, 300, 302, 303, 381/307, 308, 310, 311, 27, 28, 55, 56, 77, 381/84, 85, 86, 97, 98, 99, 100, 101, 102, 381/103, 118, 119, 120; 700/94; 181/123, 181/124
See application file for complete search history.

(56) References Cited

U.S. PATENT DOCUMENTS 4,215,242 A * 7/1980 Gross .............................. 381/63
4,350,072 A * 9/1982 Deutsch .......................... 84/605

(Continued)

FOREIGN PATENT DOCUMENTS

JP 7-82338 B2 9/1995
JP 8-76753 A 3/1996

(Continued)

*Primary Examiner* — Leshui Zhang
(74) *Attorney, Agent, or Firm* — Crowell & Moring LLP

(57) ABSTRACT

In a harmonic adding device, an input/output function part converts a digital sound signal having an input signal level into a digital sound signal having an output signal level determined according to a input/output function and the input signal level. A parameter storage unit stores at least one inflection point. A controller sets the inflection point to the input/output function to enable the input/output function part to add harmonics to the digital sound signal. The input/output function is defined between a positive maximum point and a negative maximum point. The inflection point is set between the positive maximum point and the negative maximum point. The positive maximum point, the inflection point and the negative maximum point are sequentially connected by linear interpolation to formulate the input/output function.

12 Claims, 15 Drawing Sheets

(51) Int. Cl.
*H03G 5/02* (2006.01)
*H03G 5/04* (2006.01)
*H03G 5/16* (2006.01)

(56) References Cited

U.S. PATENT DOCUMENTS

| | | | | |
|---|---|---|---|---|
| 4,586,417 | A * | 5/1986 | Kato et al. | 84/630 |
| 5,473,697 | A * | 12/1995 | Ishihara | 381/63 |
| 5,555,306 | A * | 9/1996 | Gerzon | 381/63 |
| 5,689,571 | A * | 11/1997 | Kitamura | 381/63 |
| 6,660,923 | B2 * | 12/2003 | Sato | G10H 1/06 704/209 |
| 6,845,165 | B1 * | 1/2005 | Motohashi | G10H 1/16 381/101 |
| 7,847,176 | B2 * | 12/2010 | Sugawara | 84/622 |
| 8,369,538 | B2 | 2/2013 | Akiyama et al. | |
| 8,995,675 | B2 * | 3/2015 | Chandak et al. | 381/63 |
| 2002/0009204 | A1 * | 1/2002 | Matsumura | G01S 7/52038 381/98 |
| 2002/0124713 | A1 * | 9/2002 | Sato | 84/607 |
| 2003/0007648 | A1 * | 1/2003 | Currell | 381/61 |
| 2005/0069143 | A1 * | 3/2005 | Budnikov et al. | 381/63 |
| 2006/0086237 | A1 * | 4/2006 | Burwen | 84/630 |
| 2007/0058816 | A1 * | 3/2007 | Ko | 381/1 |
| 2007/0160231 | A1 * | 7/2007 | Akiyama | G10L 21/038 381/98 |
| 2009/0165635 | A1 * | 7/2009 | Sugawara | 84/622 |

FOREIGN PATENT DOCUMENTS

| | | |
|---|---|---|
| JP | 2587650 B2 | 3/1997 |
| JP | 3605363 B2 | 12/2004 |
| JP | 2006-267790 A | 10/2006 |
| JP | 2006267790 A * | 10/2006 |
| JP | 2007-178675 A | 7/2007 |
| JP | 4787316 B2 | 10/2011 |

* cited by examiner

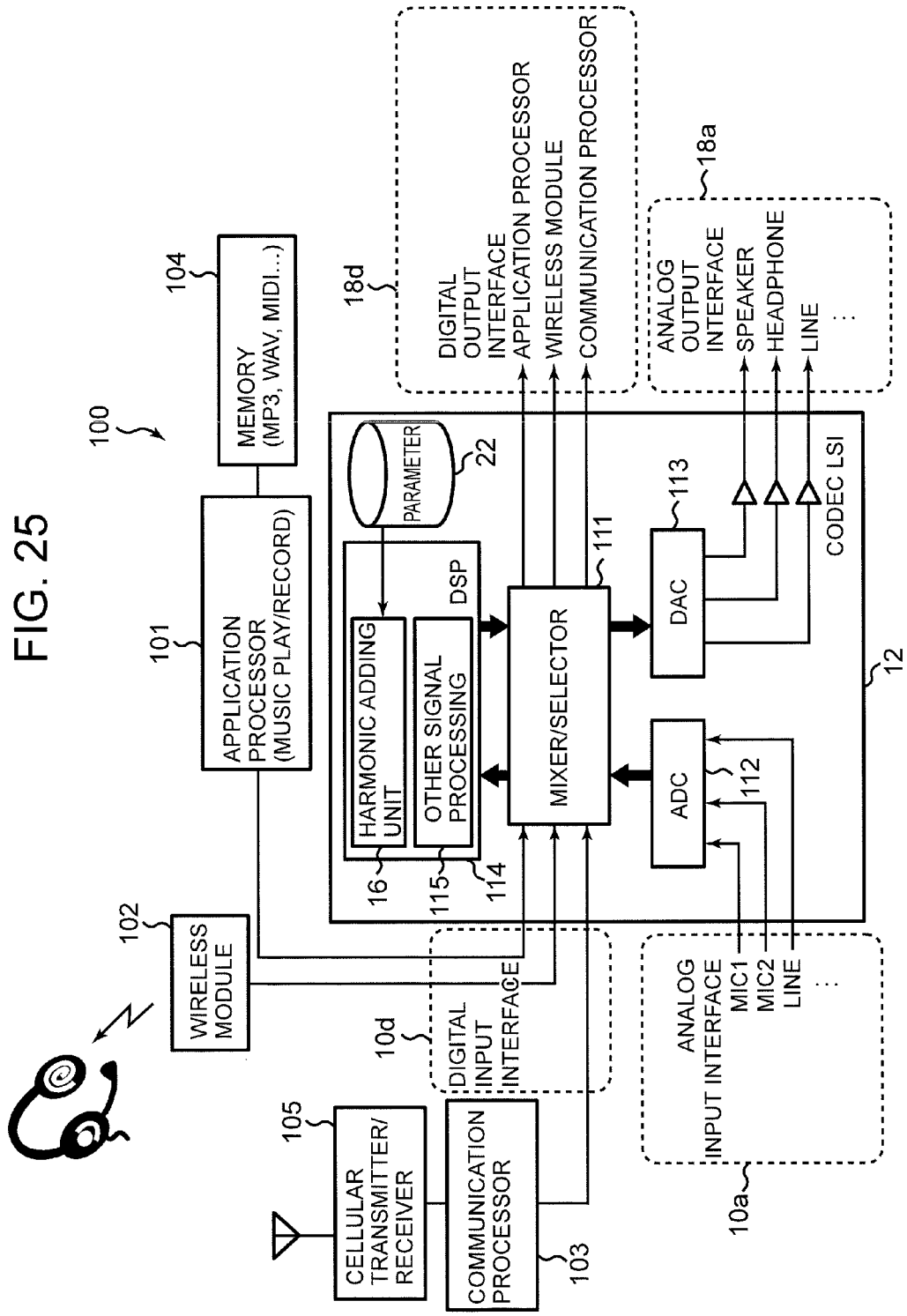

DEVICE FOR ADDING HARMONICS TO SOUND SIGNAL

BACKGROUND OF THE INVENTION

1. Technical Field of the Invention

The present invention relates to a device for adding harmonics to a sound signal, and more particularly, to a harmonic adding device for easily setting or changing the quantity of added harmonics, the ratio of odd-numbered harmonics to even-numbered harmonics, etc.

2. Description of the Related Art

A harmonic adding device adds harmonics to a sound signal by inputting the sound signal to a circuit having a non-linear input/output function (input/output characteristics) to distort the waveform of the sound signal, thereby controlling sound quality and providing sound effects. Conventional harmonic adding devices are disclosed in patent references 1, 2 and 3. The harmonic adding device disclosed in patent reference 1 sets a non-linear input/output function using a non-linear characteristic (S-characteristics) of a transistor. The harmonic adding device disclosed in patent reference 2 sets a non-linear input/output function using an external circuit connected to an operational amplifier. The harmonic adding device disclosed in patent reference 3 sets a non-linear input/output function according to a non-linear characteristic stored in a gain table.

[Patent Reference 1] Japanese Patent No. 3605363

[Patent Reference 2] Japanese Patent Application Publication No. 2006-267790

[Patent Reference 3] Japanese Patent Application Publication No. 2007-178675

According to conventional harmonic adding devices, the quantity of added harmonics, the ratio of odd-numbered harmonics to even-numbered harmonics, etc. cannot be easily set or changed.

SUMMARY OF THE INVENTION

To solve the above-described problem, the present invention provides a harmonic adding device capable of easily setting or changing the quantity of added harmonics, the ratio of odd-numbered harmonics to even-numbered harmonics, etc.

A harmonic adding device according to the present invention comprises: an input/output function part that is set with an input/output function determining relationship between an input signal level and an output signal level, the input/output function part receiving a digital sound signal having an input signal level, converting the received digital sound signal into a digital sound signal having an output signal level determined according to the input/output function and the input signal level of the received digital sound signal, and outputting the converted digital sound signal having the determined output signal level; a parameter storage unit that is configured to store at least one inflection point set to the input/output function for enabling the input/output function part to add harmonics to the digital sound signal; and a controller that is configured to set the inflection point stored in the parameter storage unit to the input/output function of the input/output function part, wherein the input/output function is defined between a positive maximum point at which the output signal level represents a positive maximum value when the input signal level corresponds to a positive maximum value and a negative maximum point at which the output signal level represents a negative maximum value when the input signal level corresponds to a negative maximum value, the inflection point is set between the positive maximum point and the negative maximum point, and the positive maximum point, the inflection point and the negative maximum point are sequentially connected by linear interpolation to formulate the input/output function.

Preferably, the harmonic adding device further comprises a low pass filter that is configured to suppress or remove a harmonic component having a frequency higher than a predetermined frequency and being contained in the digital sound signal outputted from the input/output function part.

According to this configuration, it is possible to easily set or change the quantity of added harmonics and the ratio of odd-numbered harmonics to even-numbered harmonics according to inflection points stored in the parameter storage unit. In this case, while an output waveform converted by the input/output function based on a polygonal line may produce a noisy sound having an edge (angle) and including lots of high-order harmonics, the edge can be smoothed by passing the output waveform through a low pass filter to produce a smoothed waveform comparative to a waveform obtained using S-characteristics. Furthermore, a process according to a combination of calculation using the input/output function based on a polygonal line and a low pass filter can reduce computational load, compared to calculation using an input/output function having S-characteristics.

The parameter storage unit according to the present invention may store the inflection point in the form of a pair of a value of the input signal level and a value of the output signal level corresponding to the input signal level. In this case, it is possible to freely set an inflection point by combining the input signal level and output signal level.

A system used for adjustment operation for determining an inflection point stored in the parameter storage unit includes a manipulator that indicates an input signal level and output signal level of each inflection point as decibel values based on a degree of manipulation and may convert the decibel values indicated by the manipulator into linear values to set an inflection point to the input/output function, as described below. When considerable harmonics are not added, an input signal level and an output signal level of an inflection point are set to small values. Accordingly, when the input signal level and output signal level of the inflection point are indicated by linear values based on a manipulation degree of the manipulator, it would be difficult to indicate small values of the input signal level and output signal level because small values are drastically changed with slight manipulation. In view of this, the input signal level and output signal level of the inflection point are indicated by decibel values based on a manipulation degree of the manipulator and the decibel values indicated by the manipulator are converted into linear values and set to the input/output function, to thereby easily indicate the inflection point having low input and output signal levels.

In a preferred form, the input/output function part according to the present invention sequentially calculates the output signal level from the input signal level of the digital sound signal using a program defining the input/output function, and outputs the digital sound signal having the calculated output signal level. Since the process using a combination of the calculation using the input/output function based on a polygonal line and preferably the low pass filter requires a small quantity of computation compared to calculation using an input/output function having S-characteristics, the process can be applied to sequential computations of a sound signal having a high sampling frequency.

The harmonic adding device of the present invention may comprise: a plurality of systems configured to process the digital sound signal in parallel to each other, the plurality of systems including a harmonic adding system containing the input/output function part being capable of adding harmonics to the digital sound signal, and a dry system excluding the input/output function part and being unable to add harmonics to the digital sound signal; and an adder configured to sum the digital sound signal having passed through the harmonic adding system and the digital sound signal having passed through the dry system.

According to this configuration, it is possible to maintain the ratio of odd-numbered harmonics to even-numbered harmonics to adjust the ratio of dry sound to harmonics by adjusting the level ratio of the harmonic adding system to the dry system.

The harmonic adding device of the present invention may comprise: a band dividing filter configured to divide the digital sound signal into a plurality of frequency band components; and a plurality of systems provided in correspondence to the plurality of the frequency band components for processing the plurality of the frequency band components in parallel to each other, each system including the input/output function part being capable of adding harmonics to the corresponding frequency band component of the digital sound signal, wherein the parameter storage unit stores at least one inflection point for each system, and the controller sets the inflection point stored in the parameter storage unit to the input/output function of the input/output function part contained in each system. Accordingly, it is possible to set harmonics added to each of the divided frequency bands.

In the harmonic adding device, preferably the parameter storage unit stores a first inflection point specified by a value of the input signal level in the range of 0 to the positive maximum value and a value of the output signal level in the range of 0 to the positive maximum value, and stores a second inflection point specified by a value of the input signal level in the range of 0 to the negative maximum value and a value of the output signal level in the range of 0 to the negative maximum value, and the controller sets the first inflection point and the second inflection point to the input/output function so that the positive maximum point, the first inflection point, the second inflection point and the negative maximum point are sequentially connected by linear interpolation to formulate the input/output function.

In the case of two inflection points, only odd-numbered harmonics or only even-numbered harmonics can be added or both odd-numbered harmonics and even-numbered harmonics can be simultaneously added.

The harmonic adding device of the present invention may further comprise a DC cutoff part configured to cut a DC component contained in the digital sound signal outputted from the input/output function part. The DC cutoff part may cut a DC component generated in the output signal of the input/output function part by setting inflection points such that the input/output function does not pass through the origin point, and thus it is possible to prevent generation of noise. Therefore, inflection points can be freely set.

The harmonic adding device of the present invention may further comprise an amplitude measurement unit configured to measure an amplitude of the digital sound signal inputted to the input/output function part, wherein when the measured amplitude of the digital sound signal is low, the controller shifts the inflection point to a low range lower than a range in which the inflection point is set when the measured amplitude is high, whereby the input/output function part can add harmonics to the digital sound signal even when the input signal level thereof is low.

Alternatively, the harmonic adding device of the present invention may further comprises: an amplitude measurement unit configured to measure an amplitude of the digital sound signal inputted to the input/output function part; an amplifier configured to amplify the digital sound signal with a variable gain and to input the amplified digital sound signal to the input/output function part; and an attenuator configured to attenuate the digital sound signal outputted form the input/output function part with a variable gain corresponding to an inverse number of the variable gain of the amplifier, wherein when the measured amplitude of the digital sound signal is low, the controller increases the variable gain of the amplifier as compared to the variable gain of the amplifier when the measured amplitude is high, whereby the input/output function part can add harmonics to the digital sound signal even when the input signal level thereof is low.

Accordingly, it is possible to generate harmonics even when the input signal level is low.

Figure 12:
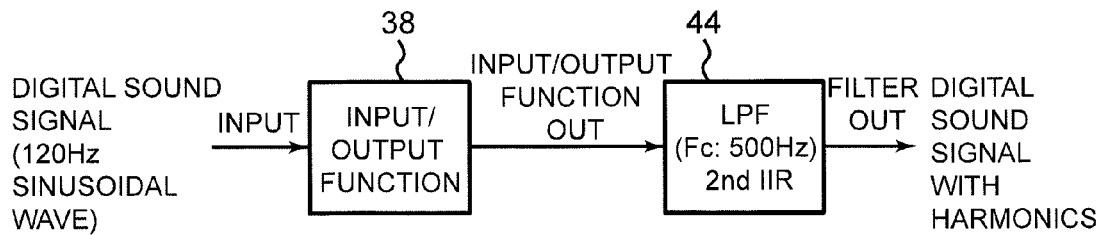
FIG. 12 is a block diagram illustrating a circuit configuration and parameters set through simulations illustrated in FIGS. 13 to 16.

14(*a*) showing waveforms of a sinusoidal signal input to the input/output function part 38 of FIG. 12, an output signal of the input/output function part 38, and an output signal of a low pass filter 44, FIG. 14(*b*) showing the frequency spectrum characteristic of the output signal of the input/output function part 38, FIG. 14(*c*) showing the frequency spectrum characteristics of the output signal of the low pass filter.

Figure 15:
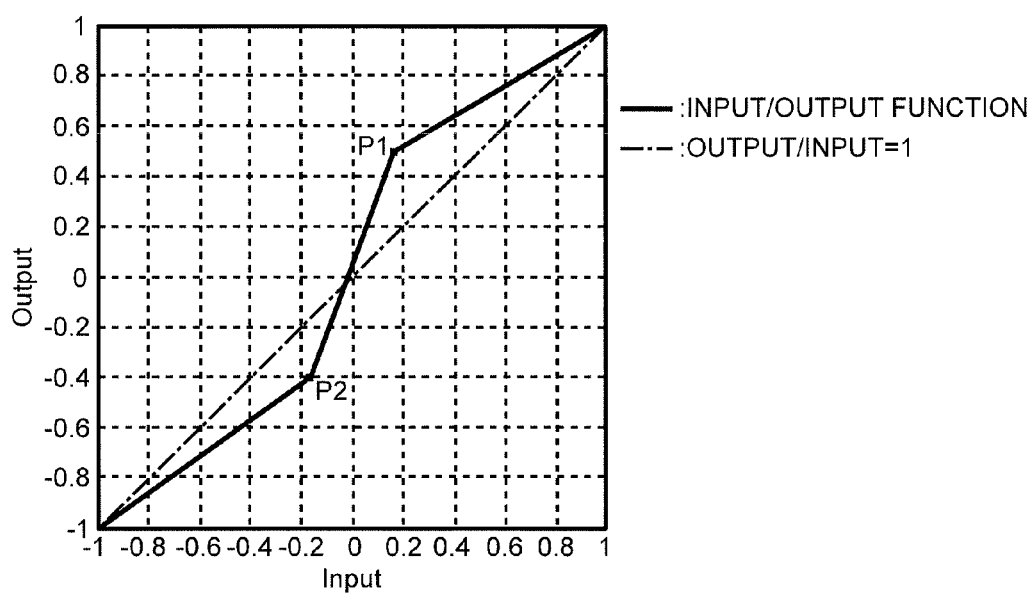

FIG. 15 shows an input/output function set to the input/output function part 38 through simulation illustrated in FIG. 12.

Figure 16A:
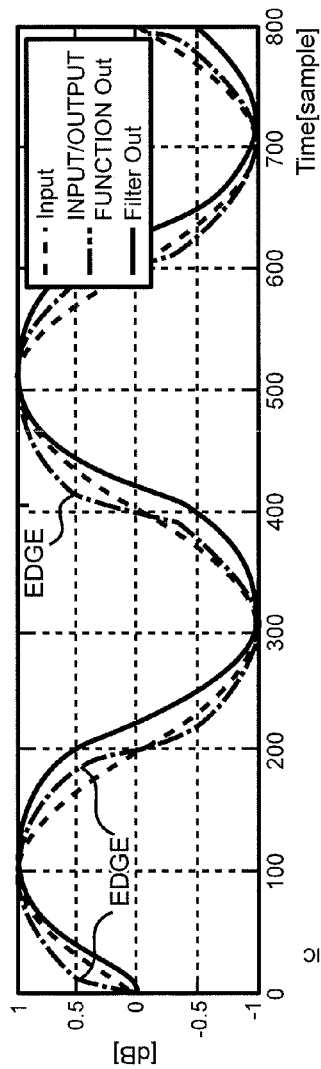
Figure 16B:
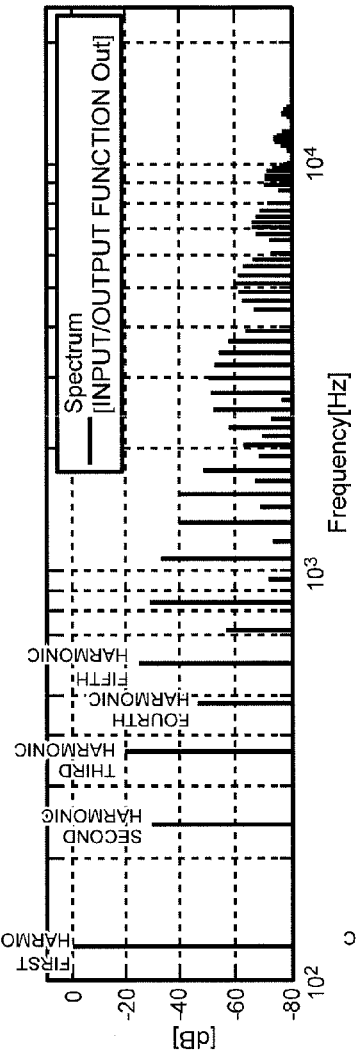
Figure 16C:
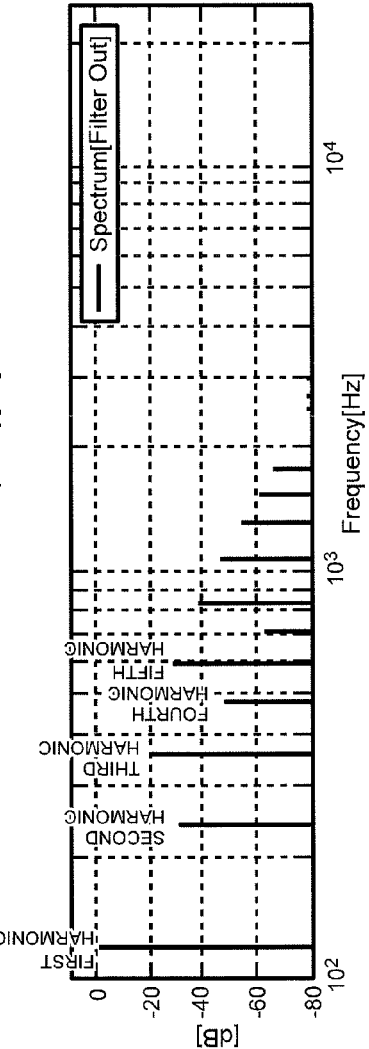

FIGS. 16(*a*), 16(*b*) and 16(*c*) illustrate simulation operation according to the input/output function of FIG. 15, FIG. 16(*a*) showing waveforms of a sinusoidal signal input to the input/output function part 38 of FIG. 12, the output signal of the input/output function part 38, and the output signal of the low pass filter 44, FIG. 16(*b*) showing the frequency spectrum characteristics of the output signal of the input/output function part 38, FIG. 16(*c*) showing the frequency spectrum characteristics of the output signal of the low pass filter.

Figure 17:
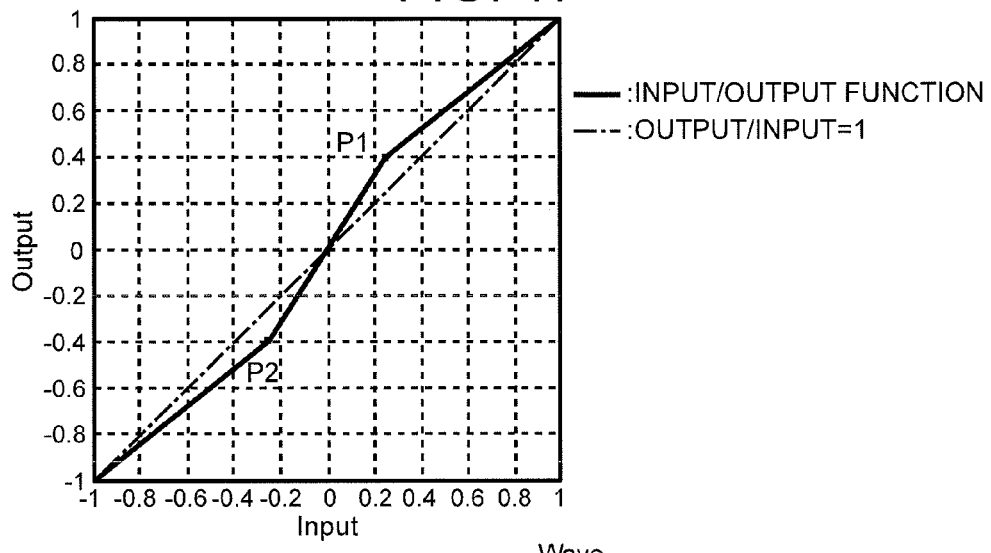

FIG. 17 shows an exemplary input/output function set to the input/output function part 38.

Figure 18:
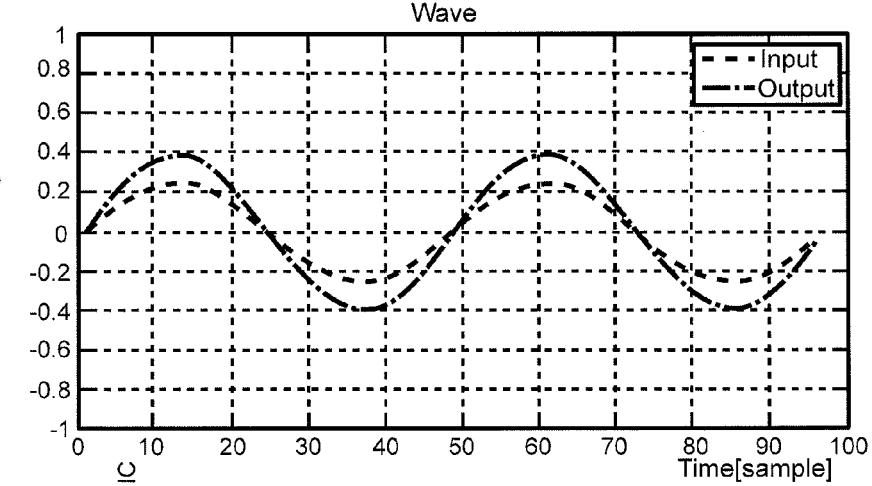
Figure 18:
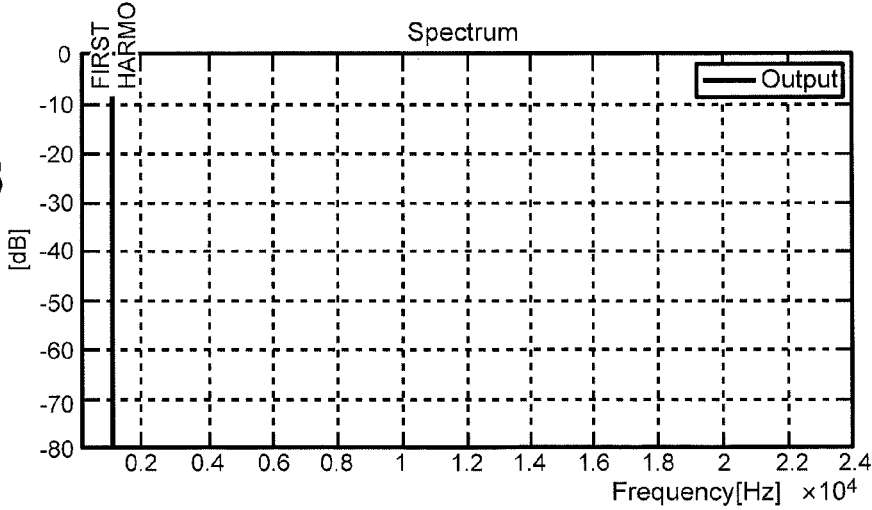

FIGS. 18(*a*) and 18(*b*) illustrate simulation operation of the input/output function part 38 when an input signal having the same level as an input signal level of an inflection point is input to the input/output function part 38 to which the input/output function of FIG. 17 is set, FIG. 18(*a*) showing waveforms of input and output signals and FIG. 18(*b*) showing the frequency spectrum characteristics of the output signal of the input/output function part 38.

Figure 1:
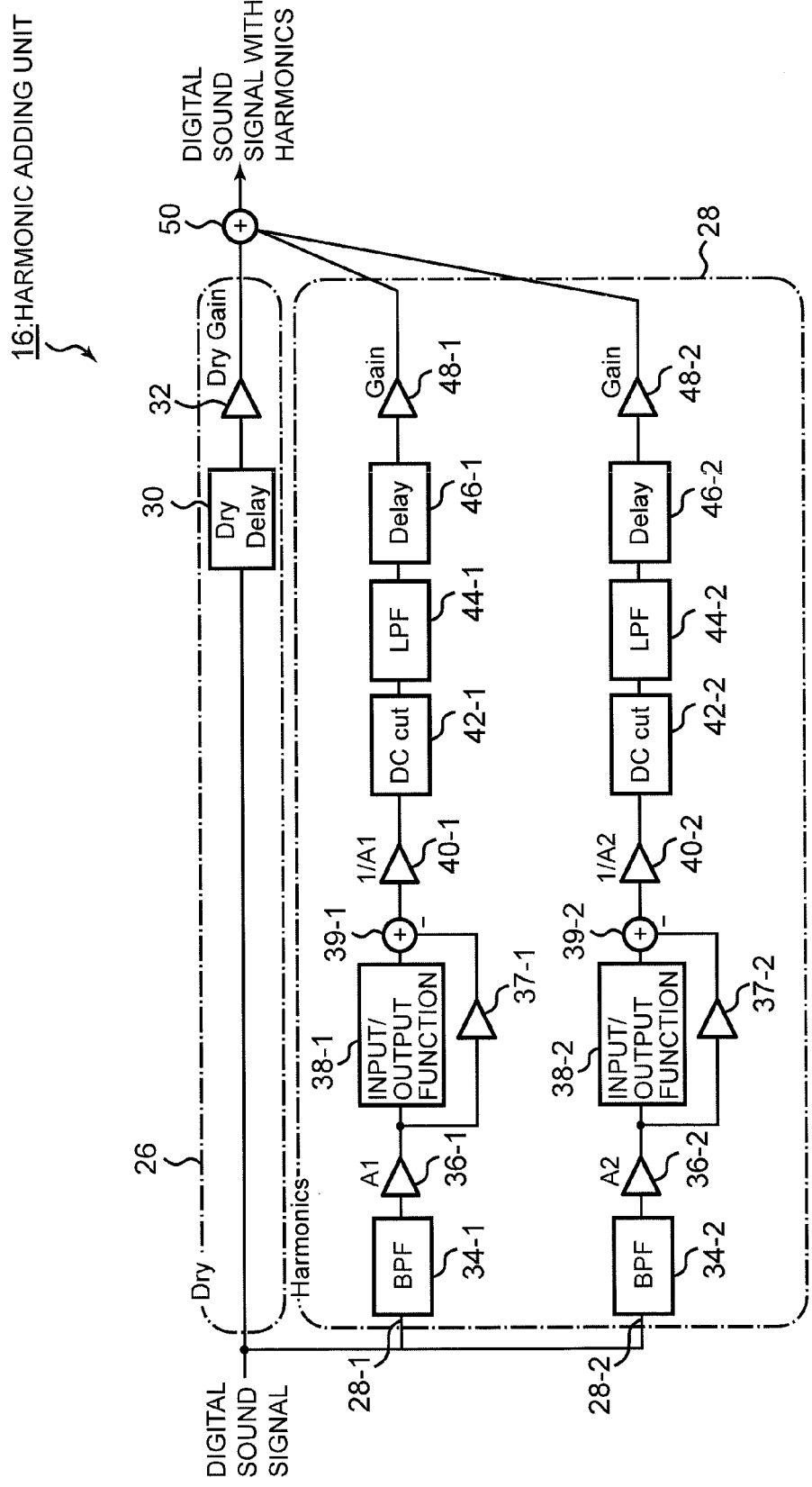
FIG. 1 is a block diagram illustrating an exemplary configuration of a harmonic adding unit 16 shown in FIGS. 2 and 3.
Figure 19:
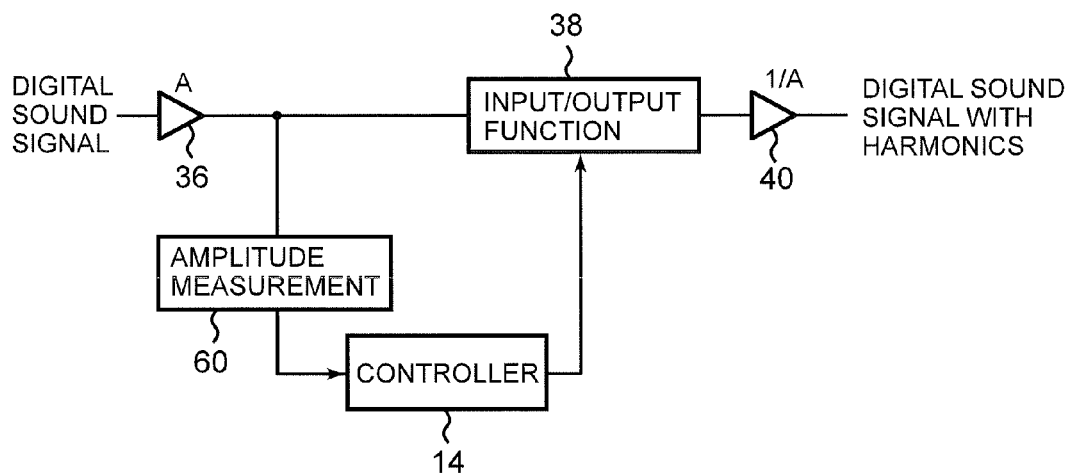

FIG. 19 is a block diagram illustrating an exemplary configuration for performing a low signal input method on part of a harmonic adding system 28 of FIG. 1.

Figure 20:
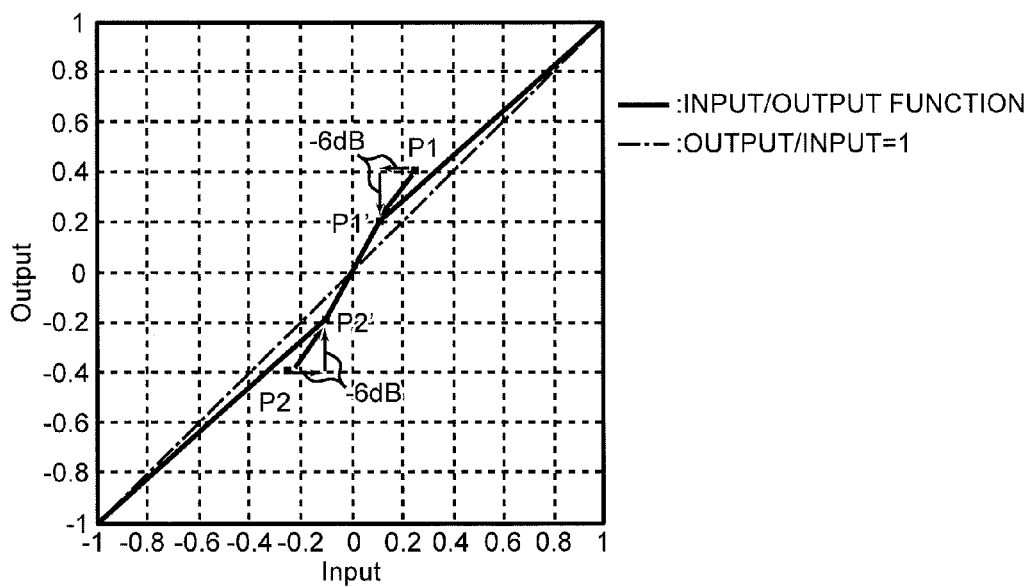

FIG. 20 shows input/output function variation according to the low signal input method of FIG. 19.

Figure 21:
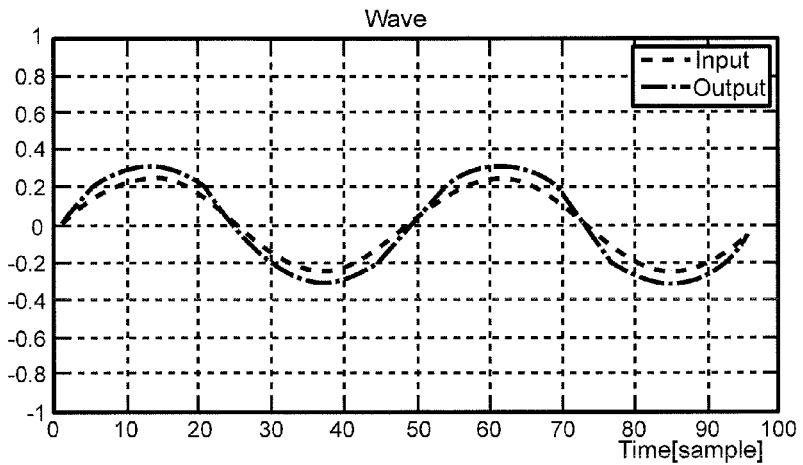
Figure 21:
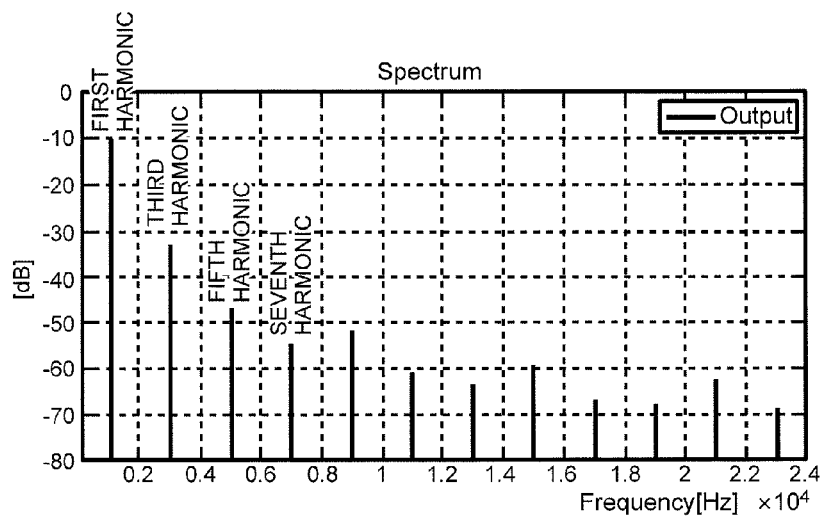

FIGS. 21(*a*) and 21(*b*) illustrate simulation operation of the input/output function part 38 to which a low-level signal is input when the low signal input method of FIG. 19 is performed, FIG. 21(*a*) showing the waveforms of input and output signals and FIG. 21(*b*) showing frequency spectrum characteristics of the output signal of the input/output function part 38.

Figure 22:
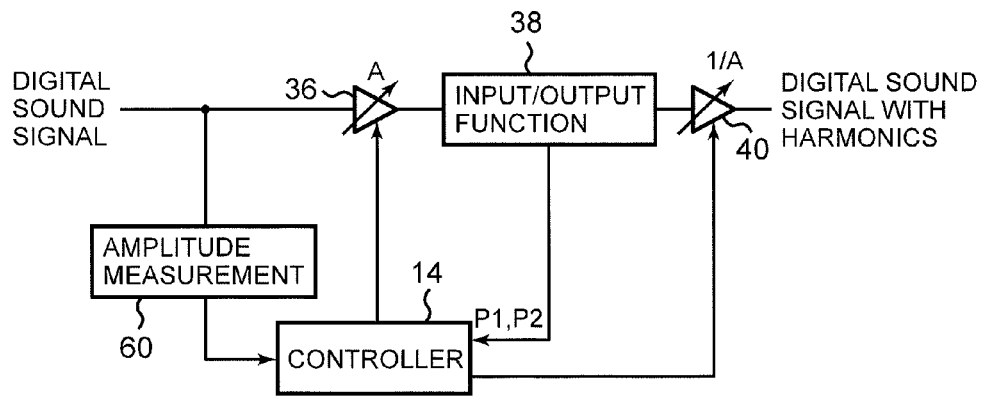

FIG. 22 is a block diagram illustrating an exemplary configuration in which another low signal input method is performed on part of the harmonic adding system 28 of FIG. 1.

Figure 23:
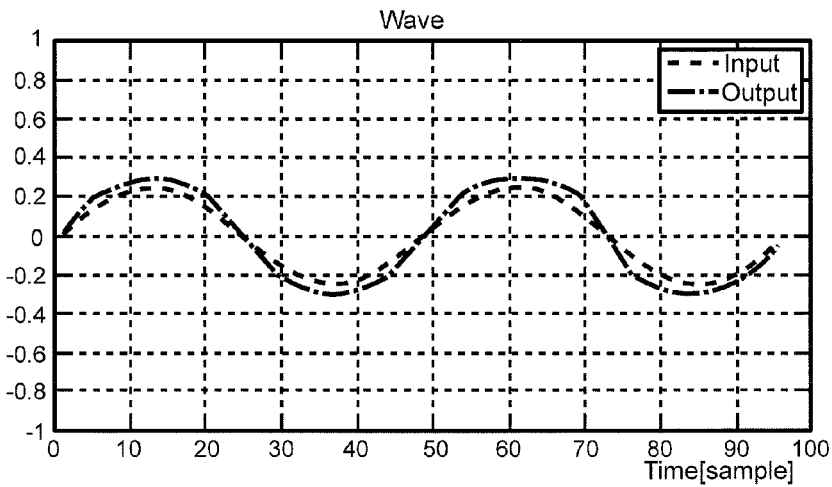
Figure 23:
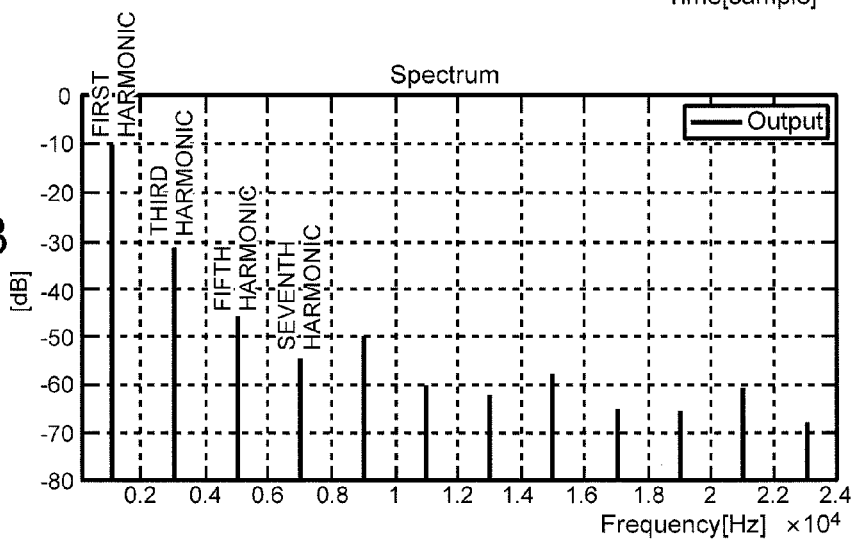

FIGS. 23(*a*) and 23(*b*) illustrate simulation operation of the input/output function part 38 to which a low-level signal is input when the low signal input method of FIG. 22 is performed, FIG. 23(*a*) showing the waveforms of input and output signals, FIG. 23(*b*) showing frequency spectrum characteristics of the output signal of the input/output function part 38.

Figure 24:
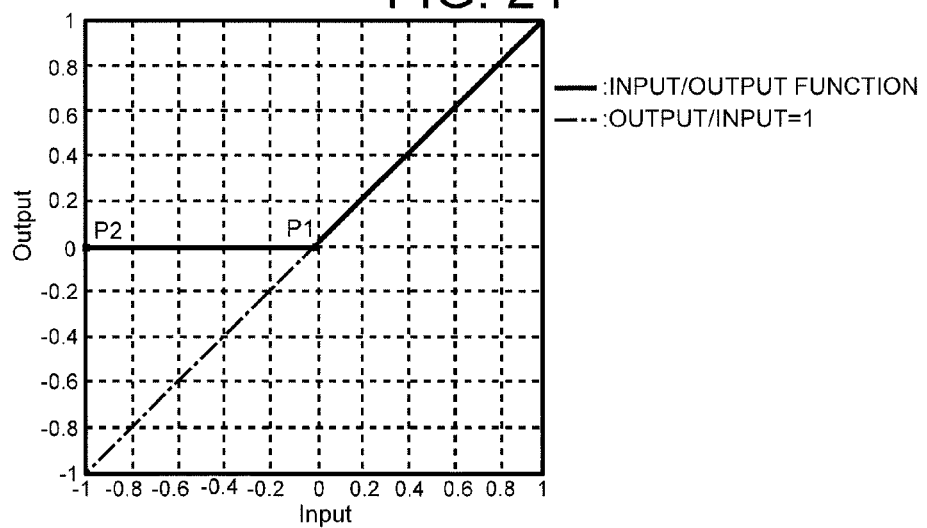

FIG. 24 shows an input/output function for adding only even-numbered harmonics.

FIG. 25 is a block diagram showing a portable terminal device 100 including a harmonic adding unit 16.

DETAILED DESCRIPTION OF THE INVENTION

Figure 2:
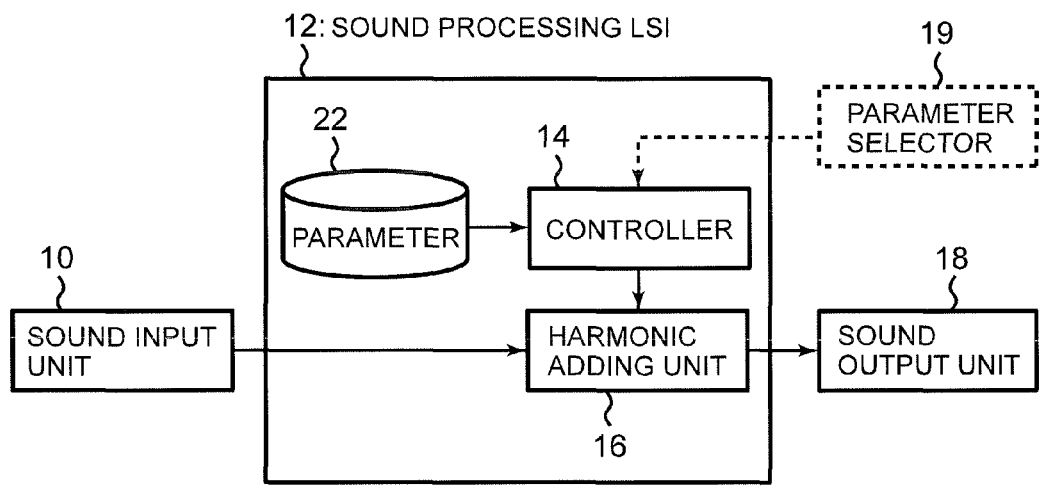
FIG. 2 is a block diagram illustrating an exemplary configuration of a sound reproduction system included in an apparatus equipped with a harmonic adding device according to the present invention.

Embodiments of the present invention will now be described. FIG. 2 illustrates an exemplary configuration of a sound reproduction system included in an apparatus equipped with a harmonic adding device according to the present invention. The apparatus equipped with the harmonic adding device may be a TV receiver, a portable terminal (mobile phone terminal), etc., for example. A digital sound signal having a predetermined sampling frequency is output from a sound input unit 10 and applied to a sound processing LSI 12.

The sound processing LSI 12 adds harmonics to the digital sound signal input thereto through digital signal processing. That is, the sound processing LSI 12 includes a harmonic adding unit 16 to which an input/output function is set and applies harmonics to the input sound signal by converting the input sound signal through the input/output function to distort the waveform of the input sound signal. The sound signal including the harmonics added thereto is output to a sound output unit 18 including a D/A converter, an audio amplifier, a speaker, etc. and reproduced. A parameter storage unit 22 is composed of a non-volatile memory such as a flash memory and stores a parameter pair (coordinate values of an inflection point of the input/output function or gradients of polygonal line and the coordinate values, a cutoff frequency of filter, gains of amplifier and attenuator, a delay of a signal delay unit, etc.) set to the harmonic adding unit 16.

A controller 14 reads the parameter pair from the parameter storage unit 22 and sets the parameter pair to the harmonic adding unit 16. The input/output function of the harmonic adding unit 16 is determined by coordinate values of an inflection point included in the read parameter pair. The parameter storage unit 22 may store a plurality of parameter pairs. When the plurality of parameter pairs is stored in the parameter storage unit 22, a parameter selector 19 is provided, as represented by a dotted line in FIG. 2, to read a parameter pair from the parameter storage unit 22 and set the read parameter pair to the harmonic adding unit 16. The parameter selector 19 may be a device that manually selects a parameter pair according to switching operation of a user or a device that automatically selects a parameter pair according to type (music, speech, etc.) of reproduced content.

Figure 3:
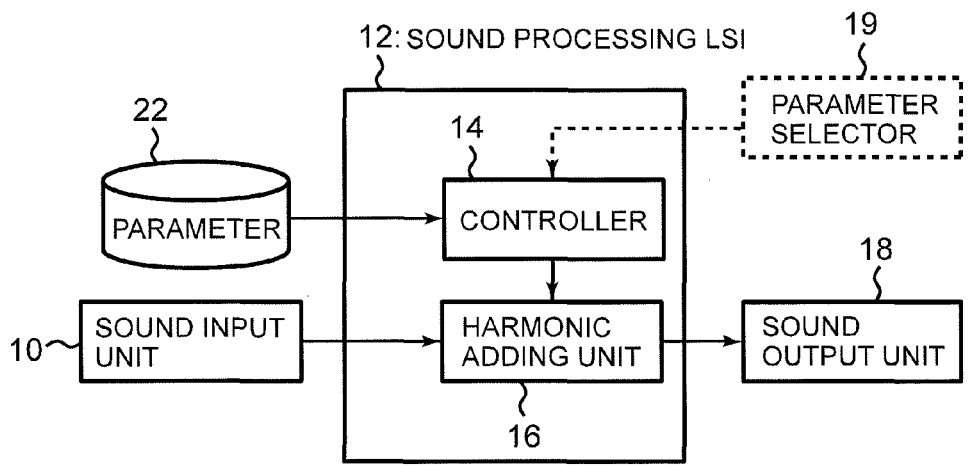
FIG. 3 is a block diagram showing another exemplary configuration of a sound reproduction system included in the apparatus equipped with the harmonic adding device according to the present invention.

FIG. 3 illustrates another exemplary configuration of a sound reproduction system included in an apparatus equipped with the harmonic adding device according to the present invention. The same numerals are used for parts corresponding to those shown in FIG. 2. The sound reproduction system includes the parameter storage unit 22 located outside the sound processing LSI 12, distinguished from the sound reproduction system of FIG. 2 in which the parameter storage unit 22 is included in the sound processing LSI 12. Components other than the parameter storage unit 22 correspond to those of the sound reproduction system of FIG. 2.

The sound reproduction systems of FIGS. 2 and 3 may be combined such that the parameter storage units 22 are respectively located inside and outside the sound processing LSI 12, one or more parameter pairs (different parameter pairs respectively stored in the parameter storage units 22) are stored in each parameter storage unit 22, and the parameter selector 19 reads a parameter pair from one of the parameter storage units 22 and sets the read parameter pair to the harmonic adding unit 16.

An exemplary configuration of the harmonic adding unit 16 of FIGS. 2 and 3 are illustrated in FIG. 1. FIG. 1 illustrates a configuration corresponding to one channel of stereo sound. When sound signals of left and right channels are processed, the harmonic adding unit 16 shown in FIG. 1 is provided for each of the left and right channels. The harmonic adding unit 16 includes a dry system 26 which outputs an input digital sound signal without adding harmonics thereto, and a harmonic adding system 28 which adds harmonics to the input sound signal and outputs the sound signal having harmonics added thereto. The harmonic adding system 28 includes a plurality of harmonic adding systems 28-1 and 28-2, which divides the band of a sound signal and adds harmonics to the divided bands. Here, the harmonic adding system 28-1 is used for a low frequency range and the harmonic adding system 28-2 is used for middle and high frequency ranges. While the number of segmented bands is 2 in the example of FIG. 1, the band of a sound signal may be segmented into a larger number of bands (e.g. low range, middle range and high range). The input sound signal is input to the dry system 26 and the harmonic adding systems 28-1 and 28-2 in parallel manner.

The dry system outputs the input sound signal through a delay 30 and a gain controller 32. The harmonic adding system 28-1 extracts a low range component of the input sound signal using a bandpass filter 34-1. The extracted low range component is amplified by an amplifier 36-1 with a gain A1 as necessary, and then input to an input/output function part 38-1. An input/output function for adding harmonics to a sound signal, which is set based on parameters (coordinate values) of an inflection point read from the parameter storage unit 22, is set to the input/output function part 38-1. The input/output function part 38-1 distorts the sound signal to apply harmonics thereto by sequentially calculating and outputting a signal level value obtained by converting a signal level value of each sample of the sound signal using the input/output function. A subtractor 39-1 performs subtraction on the sound signal output from the input/output function part 38-1 and the output signal of the amplifier 36-1, which is supplied through an amplifier 37-1, to adjust a first harmonic (which is not adjusted in a simulation which will be described later) as necessary. An attenuator 40-1 attenuates the output signal of the subtractor 39-1 with 1/A1, and a DC cutoff part 42-1 cuts a DC component of the attenuated signal. A low pass filter 44-1 suppresses or removes unnecessary high-order harmonics. The output signal of the low pass filter 44-1 is output through a signal delay 46-1 and a gain controller 48-1.

The harmonic adding system 28-2 extracts a middle-and-high range component of the input sound signal using a bandpass filter 34-2. The extracted range component is amplified by a gain A2 by an amplifier 36-2 as necessary, and then input to an input/output function part 38-2. An input/output function for adding harmonics to a sound signal, which is set based on parameters (coordinate values) of an inflection point read from the parameter storage unit 22, is set to the input/output function part 38-2. The input/output function part 38-2 distorts the sound signal to apply harmonics thereto by sequentially calculating and outputting a signal level value obtained by converting a signal level value of each sample of the sound signal using the input/output function. A subtractor 39-2 performs subtraction on the sound signal output from the input/output function part 38-2 and the output signal of the amplifier 36-2, which is supplied through an amplifier 37-2, to adjust a first harmonic (which is not adjusted in a simulation which will be described later) as necessary. An attenuator 40-2 attenuates the output signal of the subtractor 39-1 with 1/A2, and a DC cutoff part 42-2 cuts a DC component of the attenuated signal. A low pass filter 44-2 suppresses or removes unnecessary high-order harmonics. The output signal of the low pass filter 44-2 is output through a signal delay 46-2 and a gain controller 48-2. The DC cutoff parts 42-1 and 42-2 may be configured as a high pass filter, for example. The band dividing filters 34-1 and 34-2 may be respectively configured as a low pass filter and a high pass filter without being limited to a bandpass filter. A cutoff frequency when the DC cutoff parts 42-1 and 42-2 are implemented as a high pass filter and a cutoff frequency of the low pass filters 44-1 and 44-2 are set according to parameters of cutoff frequencies, read from the parameter storage unit 22 (FIGS. 2 and 3).

Sound signals output from the dry system 26 and the harmonic adding systems 28-1 and 28-2 are summed by an adder 50, input to the sound output unit 18 (FIGS. 2 and 3), converted into an analog signal, and then amplified and reproduced through a speaker. Prior to summing of the signals from the dry system 26 and the harmonic adding systems 28-1 and 28-2, the signal delays 30, 46-1 and 46-2 adjust phases of the signals and gain controllers 32, 48-1 and 48-2 control the levels of the signals. As the gains of the gain controllers 48-1 and 48-2 increase, effects according to harmonics are enhanced. When the gain of the gain controller 48-1 for low range is increased, harmonics of the input sound signal can be emphasized. For example, when a small speaker is used and the low range component of the input sound signal includes a frequency component lower than a reproduction frequency band of the speaker, the low range component, which is not actually reproduced, can be perceived according to missing fundamental phenomenon by emphasizing harmonics of the low range component. Furthermore, when the gain of the gain controller 48-2 for middle and high ranges is increased, harmonics of middle-and-high range components of the input sound signal can be emphasized. It is possible to reproduce harmonious sound or sound with emphasized harmonics effect by adjusting the phase and gain of the input sound signal between the systems. The signal delays 30, 46-1 and 46-2 may be implemented as a delay circuit for delaying a signal on a sample basis, an all-pass filter for changing a phase, a parametric equalizer for changing a phase for each frequency band, etc. If the signal delays 30, 46-1 and 46-2 are implemented as the parametric equalizer, the signal delays 30, 46-1 and 46-2 and the gain controllers 32, 48-1 and 48-2 can be combined.

Figure 4:
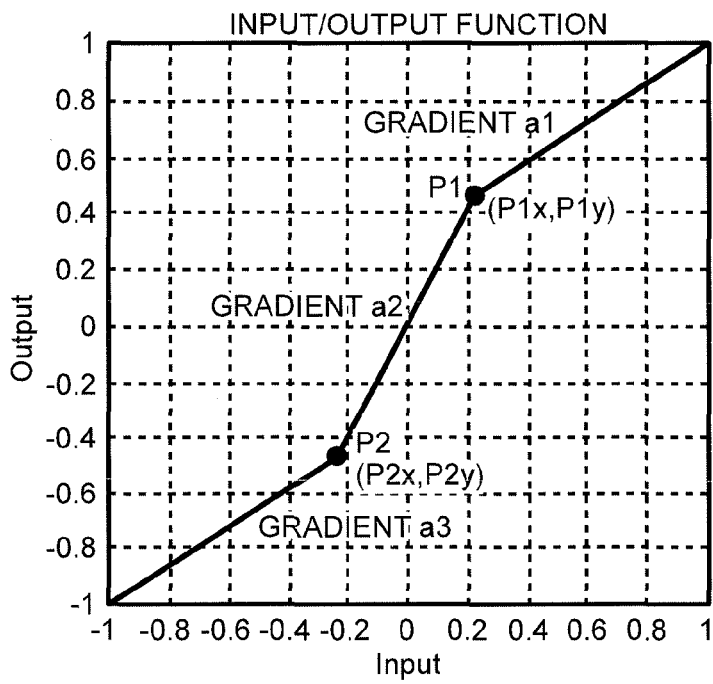
FIG. 4 shows an exemplary input/output function set to input/output function parts 38-1 and 38-2 shown in FIG. 1.

An exemplary input/output function set to the input/output function parts 38-1 and 38-2 is shown in FIG. 4. FIG. 4 is a linear graph showing the relationship between an input signal level and an output signal level when a positive full scale value (maximum value, that is, full bit value) of an input sound signal is 1 and a negative full scale value (maximum value or full bit value) thereof is −1. When the output signal levels at the positive and negative full scale points of the input signal are fixed to 1 and two points P1 and P2 (inflection points) therebetween are set to parameters of inflection points, read from the parameter storage unit 22, a characteristic obtained by connecting these four points with three straight lines (polygonal line, broken line or zigzag line) is set as an input/output function. The parameters of the inflection points P1 and P2 are given as coordinate values (linear values) on the graph, which have input and output signal level values of 0 as the origin and correspond to a combination of an input signal level value and an output signal level value, that is, P1=(P1x, P1y) and P2=(P2x, P2y). The controller 14 (FIGS. 2 and 3) calculates gradients a1, a2 and a3 of the three straight lines connecting the four points according to linear interpolation based on the coordinate values of the inflection points P1 and P2, read from the parameter storage unit 22, according to the following equations.

Gradient a1 between the positive full scale point (positive maximum point) and inflection point P1=(1−P1y)/(1−P1x)

Gradient a2 between the inflection points P1 and P2=(P1y−P2y)/(P1x−P2x)

Gradient a3 between the inflection point P2 and the negative full scale point (negative maximum point)={P2y−(−1)}/{P2x−(−1)}

The gradients a1, a2 and a3 may be calculated by a system (which will be described below with reference to FIG. 5) used to adjust parameters through a parameter setting tool on the basis of adjusted coordinate values of the inflection points P1 and P2, rather than being calculated by the sound reproduction system (FIGS. 2 and 3). In this case, gradients a1, a2 and a3 calculated by the parameter setting tool based on the finally determined coordinate values of the inflection points P1 and P2 may be transmitted with the determined coordinate values P1x, P1y, P2x and P2y of the inflection points P1 and P2 from the system (FIG. 5) used to adjust parameters to the sound reproduction system (FIGS. 2 and 3) and stored in the parameter storage unit 22. Accordingly, it is possible to read the gradients a1, a2 and a3 from the parameter storage unit 22 and use the read gradients a1, a2 and a3, instead of previously calculating the gradients a1, a2 and a3 by the sound reproduction system.

A program for setting an input/output function is installed in the input/output function parts 38-1 and 38-2. The program may be created by the following C-language program, for example. Upon calculation of the gradients a1, a2 and a3, the controller 14 stores the gradients a1, a2 and a3 in the parameter storage unit 22 (or transmits gradients a1, a2 and a3 calculated through the parameter setting tool from the system used for parameter adjustment and stores the gradients a1, a2 and a3 in the parameter storage unit 22 when the gradients a1, a2 and a3 calculated through the parameter setting tool are used), reads the coordinate values of the inflection points P1 and P2 and the gradients a1, a2 and a3 from the parameter storage unit 22, and applies the coordinate values and the gradients a1, a2 and a3 to the input/output function to set the input/output function. The input/output function parts 38-1 and 38-2 apply a signal value x of each sample of the input signal to the input/output function to sequentially calculate a corresponding output signal value y and output the signal value y as an output signal sample.

<<C Language Program for Setting an Input/Output Function>>

```
if(x > P1x) {
    y = a1*(x-P1x) + P1y;
} else if (x > P2x) {
    y = a2*(x-P2x) + P2y;
} else {
    y = a3*(x+1.0) - 1.0;
}
```

Figure 5:
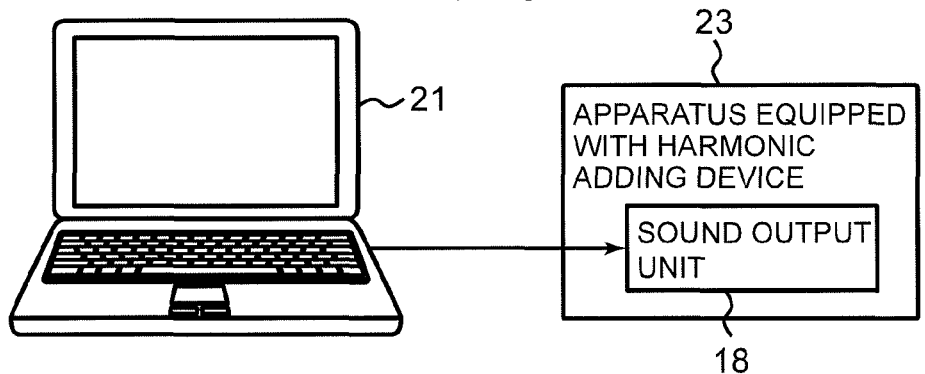
FIG. 5 is a block diagram illustrating an exemplary configuration of a system used for operation of adjusting parameters stored in a parameter storage unit 22 shown in FIGS. 2 and 3.

A method for determining a parameter stored in the parameter storage unit 22 shown in FIGS. 2 and 3 will now be described. For example, a parameter is determined in such a manner that a user adjusts the parameter while testing reproduced sound using an actual apparatus (TV receiver, portable terminal or the like). An exemplary configuration of a system used for the adjustment operation is illustrated in FIG. 5. A parameter setting tool (program) including a sound processing program for sound processing corresponding to the harmonic adding unit 16 of FIG. 1 and a manual parameter adjustment program used for a user to manually adjust various parameters set to the sound processing program is installed in a personal computer (PC) 21. When the user adjusts a parameter through a parameter setting screen displayed on a display of the PC 21 by means of the manual parameter adjustment program, the adjusted parameter is set to the sound processing program and the sound processing program performs corresponding sound processing on a test sound signal and outputs the processed test sound signal. When coordinate values P1x, P1y, P2x and P2y of the inflection points P1 and P2 of the input/output function have been adjusted, the parameter setting tool calculates the gradients a1, a2 and a3 and sets them to the sound processing program. An apparatus 23 equipped with the harmonic adding device is hardware (test equipment) that needs to be equipped with the harmonic adding device, receives a sound signal (corresponding to the output sound signal of the harmonic adding unit 16 of FIGS. 2 and 3) output from the PC 21 and reproduces sound corresponding to the sound signal through a speaker of the sound output device 18 (corresponding to the sound output unit 18 of FIGS. 2 and 3) including a D/A converter, an audio amplifier, the speaker, etc. The user repeats adjustment of the parameter while listening to the sound to determine a best parameter or optimum parameter. This manipulation operation is performed on each parameter (that is, the coordinate values of the inflection points P1 and P2 of the input/output function set to the input/output function parts 38-1 and 38-2 of FIG. 1, cutoff frequencies of the bandpass filters 28-1 and 28-2 and low pass filters 44-1 and 44-2, delays of the signal delays 30, 46-1 and 46-2, gains of the gain adjustors 32, 48-1 and 48-2, etc.). Upon determination of each parameter, the manufacturer of the apparatus 23 equipped with the harmonic adding device stores the determined parameters (which can include the calculated gradients a1, a2 and a3, as described above) in the parameter storage unit 22 (FIGS. 2 and 3) of product of the same model as the apparatus 23 (test apparatus), which will be on the market, and launches the apparatus. As a result, a user of the apparatus can listen to reproduced sound to which appropriate harmonics have been added without adjusting parameters. In addition to the system configuration shown in FIG. 5, an evaluation board may be interposed between the personal computer 21 and the apparatus 23 equipped with the harmonic adding device such that the personal computer 21 can be connected to the apparatus 23 through the evaluation board to perform adjustment. In this case, a sound processing LSI (corresponding to the sound processing LSI 12 of FIGS. 2 and 3) is included in the evaluation board. When the coordinate values of the inflection points P1 and P2 and other parameters are set through the personal computer 21, these set values are set to the sound processing LSI of the evaluation board. The sound processing LSI performs corresponding sound processing on a test sound signal and outputs the processed test sound signal. The apparatus 23 equipped with the harmonic adding device receives the sound signal (corresponding to the output sound signal of the harmonic adding unit 16 of FIGS. 2 and 3) output from the sound processing LSI of the evaluation board and reproduces the sound signal through the speaker of the sound output device 18 (corresponding to the sound output unit 18 of FIGS. 2 and 3) including the D/A converter, audio amplifier and speaker. The operator repeatedly adjusts the parameters while listening to the sound reproduced through the speaker to determine the best parameters. In this manner, adjustment can be performed more practically using the sound processing LSI.

Figure 6:
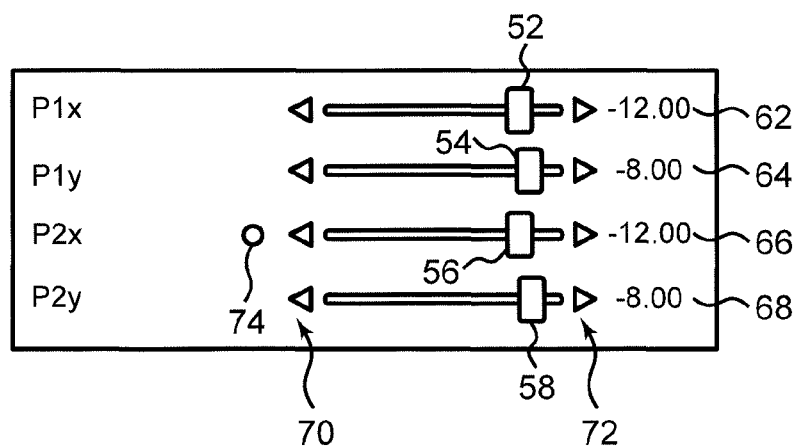
FIG. 6 shows an exemplary manipulation panel displayed on a display screen of a personal computer 21 shown in FIG. 5, by which a user adjusts coordinate values of inflection points P1 and P2.

FIG. 6 shows an exemplary manipulation panel display through which the user adjusts the inflection points P1 and P2 on the display screen of the personal computer 21. The manipulation panel display includes sliders 52, 54, 56 and 58 that indicate attenuation rates with respect to full scale values corresponding to x and y coordinates values P1x, P1y, P2x and P2y (P1x and P1y are values in the range of 0 to +1 and P2x and P2y are values in the range of 0 to −1) of the inflection points P1 and P2 as decibel values. The sliders 52, 54, 56 and 58 indicate attenuation rates (decibel values) with respect to the full scale values as displacement from the right end. That is, the right end corresponds to 0 dB, that is, full scale values (coordinate values P1x, P1y=1, P2x, P2y=−1), the left end corresponds to −96 dB, that is, a 16-bit digital signal having a least significant bit of "1" (or infinite dB, that is, all bits are "0") (corresponding to P1x, P1y P2x and P2y=0), and a position between the left and right ends indicates an attenuation rate (decibel value) (corresponding to 0<P1x, P1y<1, −1<P2x, P2y<0) in proportion to displacement from the right end. Indicators 62, 64, 66 and 68 that represent the values indicated by the sliders 52, 54, 56 and 58 as numerical values (decibel) of input/output levels with respect to the full scale are respectively displayed beside the sliders 52, 54, 56 and 58 in the manipulation panel display. When the user puts a pointer on one of the sliders 52, 54, 56 and 58 on the manipulation panel display and slides the slider to an arbitrary position to indicate a reduction rate (decibel value) with respect to the full scale value, the manual parameter adjustment program converts the decibel value (in the range of 0 dB to −96 dB or 0 dB to infinite dB) into a coordinate value in the range of 0 to +1 or 0 to −1 and inputs the coordinate value to the input/output function setting program to set input/output characteristics. Accordingly, the inflection point P1 is set to an arbitrary point in the range defined by the origin (0, 0) and points (1, 0), (1, 1) and (0, 1) and the inflection point P2 is set to an arbitrary point in the range defined by the origin (0, 0) and points (−1, 0), (−1, −1) and (0, −1). When the harmonic adding device is used as an enhancer to adjust sound quality, harmonics are slightly added, and thus inflection points are set close to the origin (0, 0) in many cases. In this case, when a coordinate value (linear value) of an inflection point is directly indicated by a manipulator, it is difficult to accurately indicate the position of the inflection point near the origin. In view of this, when a decibel value of attenuation with respect to a full scale value is indicated in proportion to a degree of manipulation of a manipulator, as described above, and the decibel value is converted into a coordinate value (linear value) to set an inflection point of input/output characteristics, the position of the inflection point can be accurately indicated even around the origin. In FIG. 6, reference numerals 70 and 72 denote fine adjustment buttons. The user can finely slide the sliders 52, 54, 56 and 58 to a corresponding direction by pressing the fine adjustment buttons. Reference numeral 74 denotes a button for setting the inflection points P1 and P2 symmetrically about the origin (0, 0). When the button 74 is ON to set one of the inflection points, P1 (P1x, P1y), the other inflection point P2 (P2x, P2y) is automatically set in a point symmetrical position (−P1x, −P1y) for the inflection point P1 (P1x, P1y). While the inflection points are set only to the first quadrant and the third quadrant of the coordinate in the above description, the inflection points may be set to the second quadrant (range defined by the origin (0, 0) and points (0, 1), (−1, 1) and (−1, 0)) and the fourth quadrant (range defined by the origin (0, 0) and points (1, 0), (1, −1) and (0, −1)).

When the characteristic diagram (polygonal line of FIG. 7) of the set input/output function is displayed in addition to the display of FIG. 6, the user can approximately assume the type (only odd-numbered harmonics, odd-numbered harmonics+even-numbered harmonics, only even-numbered harmonics) of added harmonics, the ratio of odd-numbered harmonics to even-numbered harmonics, etc. from the shape of the polygonal line. That is, the user can assume the following.

Figure 7:
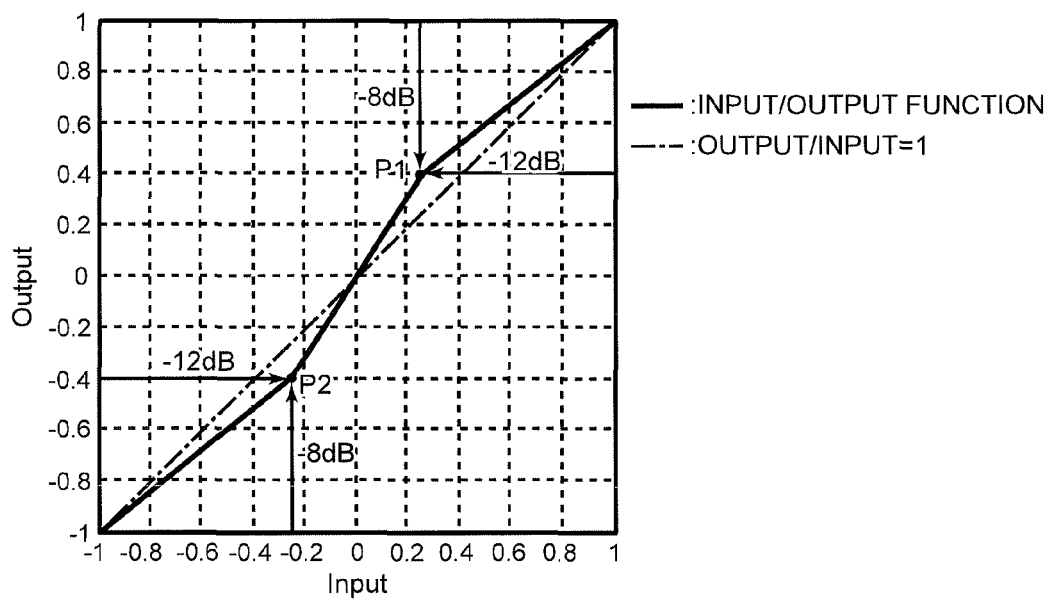
FIG. 7 shows an input/output function according to determination of the inflection points P1 and P2 of FIG. 6.
Figure 8:
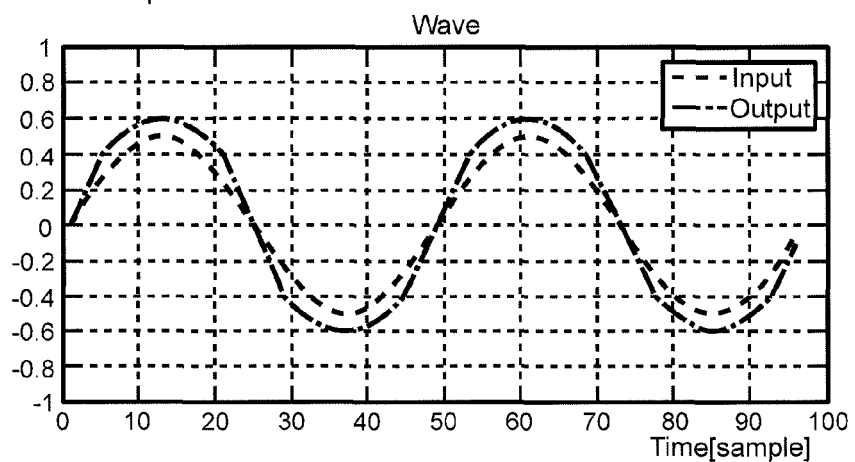
FIG. 8(a) shows a simulation waveform of an output signal when a sinusoidal signal is input to an input/output function part 38 to which the input/output function of FIG. 7 is set.
FIG. 8(b) shows frequency spectrum characteristic of the output signal of FIG. 8(a).
Figure 8:
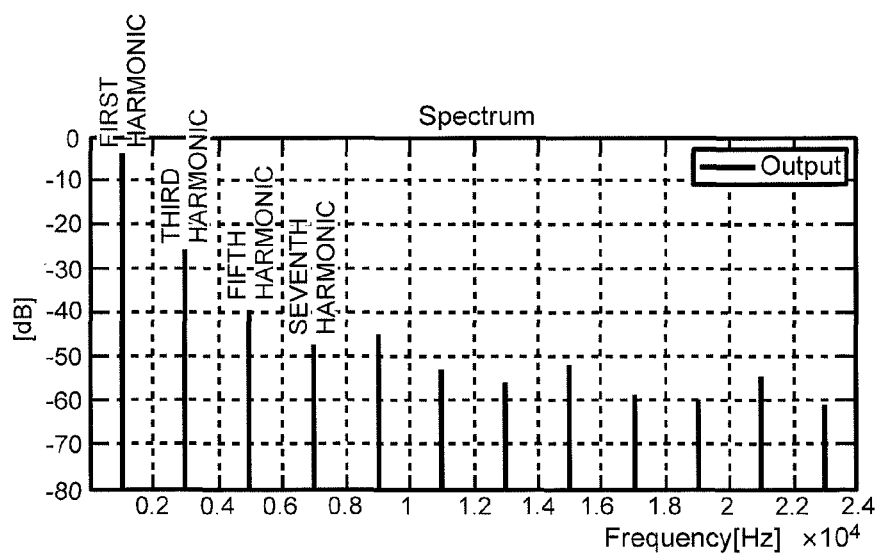

The polygonal line is symmetrical about the origin (0, 0): only odd-numbered harmonics The polygonal line is asymmetrical about the origin (0, 0): odd-numbered harmonics+even-numbered harmonics A degree of point asymmetry is small: the rate of even-numbered harmonics is low A degree of point asymmetry is large: the rate of even-numbered harmonics is high The polygonal line corresponds to half-wave rectification: only even-numbered harmonics The slope of the polygonal line is large: intensive harmonics are output FIG. 6 shows the manipulation panel display when P1x=−12 dB, P1y=−8 dB, P2x=−12 dB and P2y=−8 dB with respect to the full scale value, and the input/output function in this case is shown in FIG. 7. The output signal waveform of the input/output function parts 38-1 and 38-2 when the input/output function is set to the input/output function parts 38-1 and 38-2 and a 1 kHz sine-wave signal (digital signal having a sampling frequency of 48 kHz and 16 quantization bits) is input to the input/output function parts 38-1 and 38-2 is shown as a chain line in FIG. 8(a) (broken line corresponds to an input signal waveform), and the frequency spectrum characteristics of the output signal are shown in FIG. 8(b). Since the characteristic of FIG. 7 is symmetrical relative to the origin (0, 0), the output signal includes only odd-numbered harmonics added for the basic or first harmonic of 1 kHz, as shown in FIG. 8(b).

Figure 9:
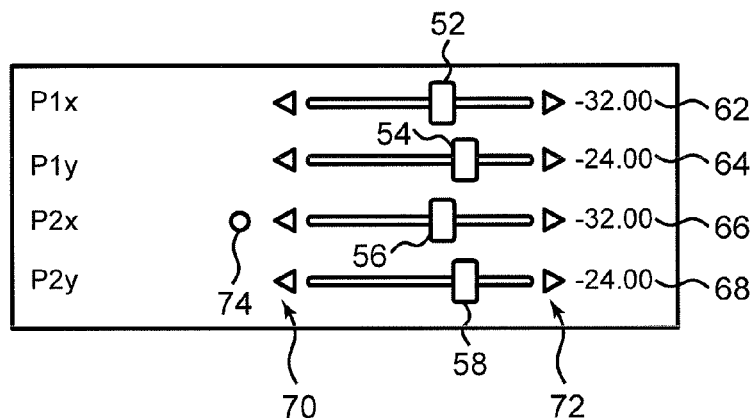
FIG. 9 illustrates another example of adjustment of the inflection points P1 and P2 through the manipulation panel display of FIG. 6.
Figure 10:
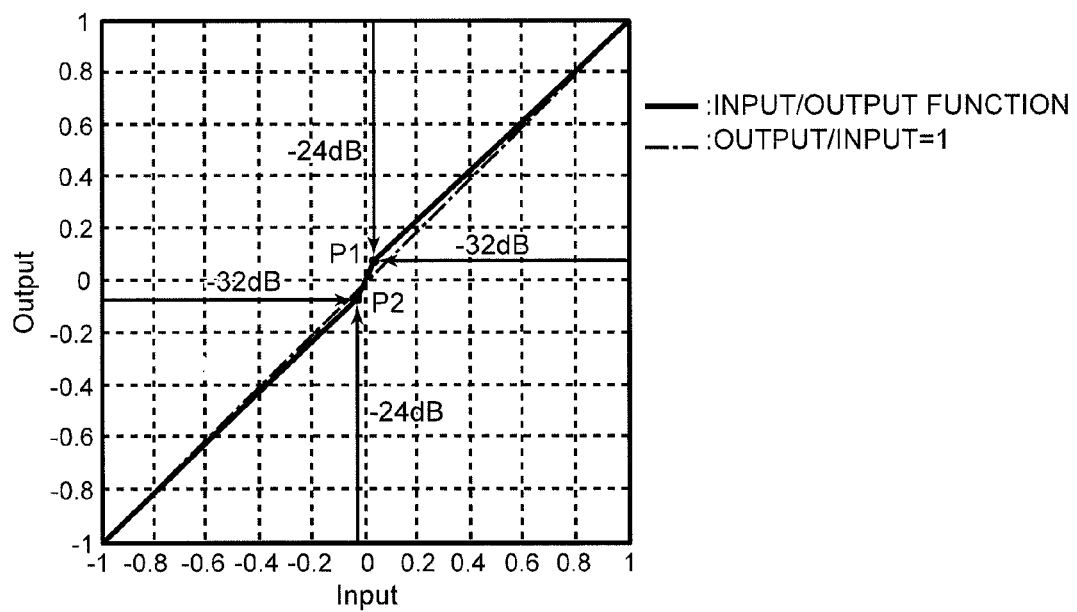
FIG. 10 shows an input/output function determined according to the inflection points P1 and P2 of FIG. 9.
Figure 11A:
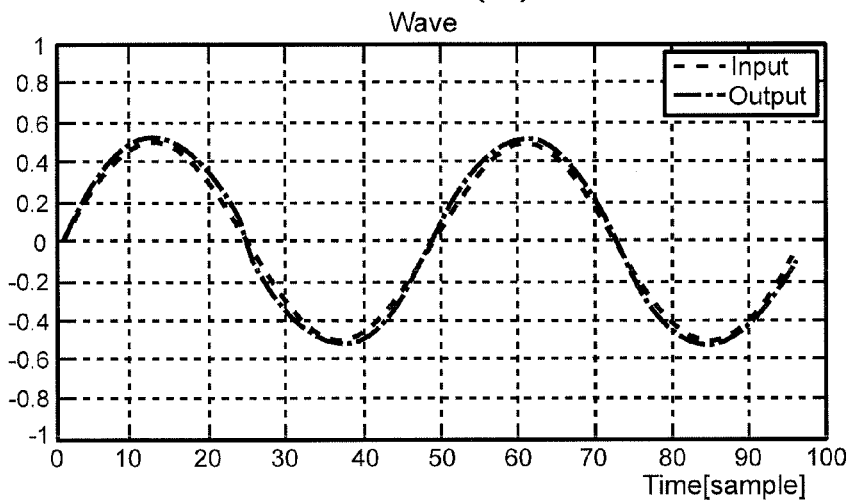
FIG. 11(a) shows a simulation waveform of an output signal when a sinusoidal signal is input to the input/output function part 38 to which the input/output function of FIG. 10 is set.
Figure 11B:
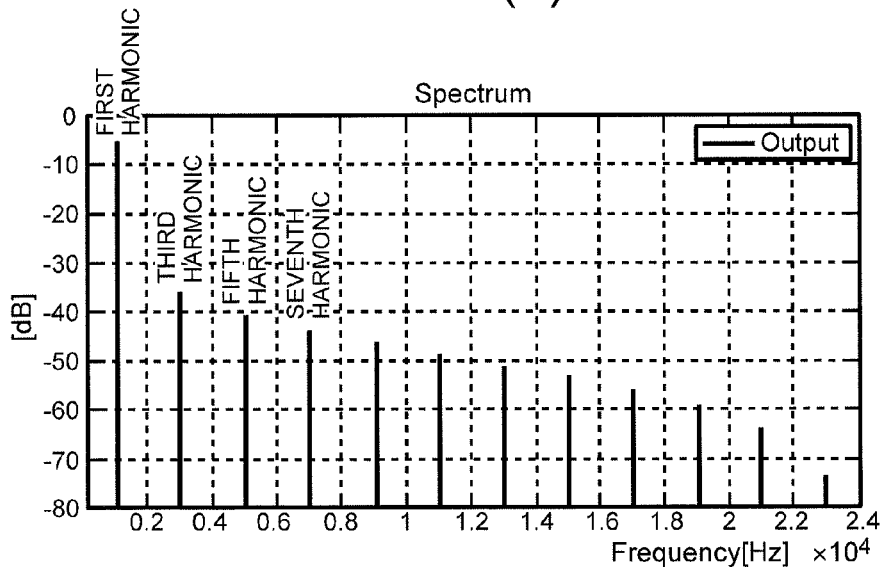
FIG. 11(b) shows frequency spectrum characteristics of the output signal of FIG. 11(a).

FIG. 9 shows another exemplary manipulation panel display with respect to the inflection points P1 and P2. The manipulation panel display of FIG. 9 corresponds to a case in which P1x=−32 dB, P1y=−24 dB, P2x=−32 dB and P2y=−24 dB with respect to the full scale value, and the input/output function in this case is shown in FIG. 10. The output signal waveform of the input/output function parts 38-1 and 38-2 when the input/output function is set to the input/output function parts 38-1 and 38-2 and a 1 kHz sine-wave signal (digital signal having a sampling frequency of 48 kHz and 16 quantization bits) is input to the input/output function parts 38-1 and 38-2 is shown as a chain line in FIG. 11(a) (broken line corresponds to an input signal waveform), and the frequency spectrum characteristics of the output signal are shown in FIG. 11(b). Since the characteristic of FIG. 10 is symmetrical about the origin (0, 0), the output signal includes only odd-numbered harmonics added for the first harmonic of 1 kHz, as shown in FIG. 11(b). Furthermore, in case of the input/output function of FIG. 10, a variation in the input/output function corresponding to input:output=1:1 (function represented by the chain line in FIGS. 7 and 10, that is, characteristic generating no harmonics) is small, compared to the input/output function of FIG. 7. Accordingly, a difference between the input signal waveform and the output signal waveform in case of FIG. 11(a) is smaller than that of FIG. 8(a), and thus the quantity of harmonic components relative to the first or fundamental harmonic in case of FIG. 11(b) is smaller than that of FIG. 8(b).

Figure 13:
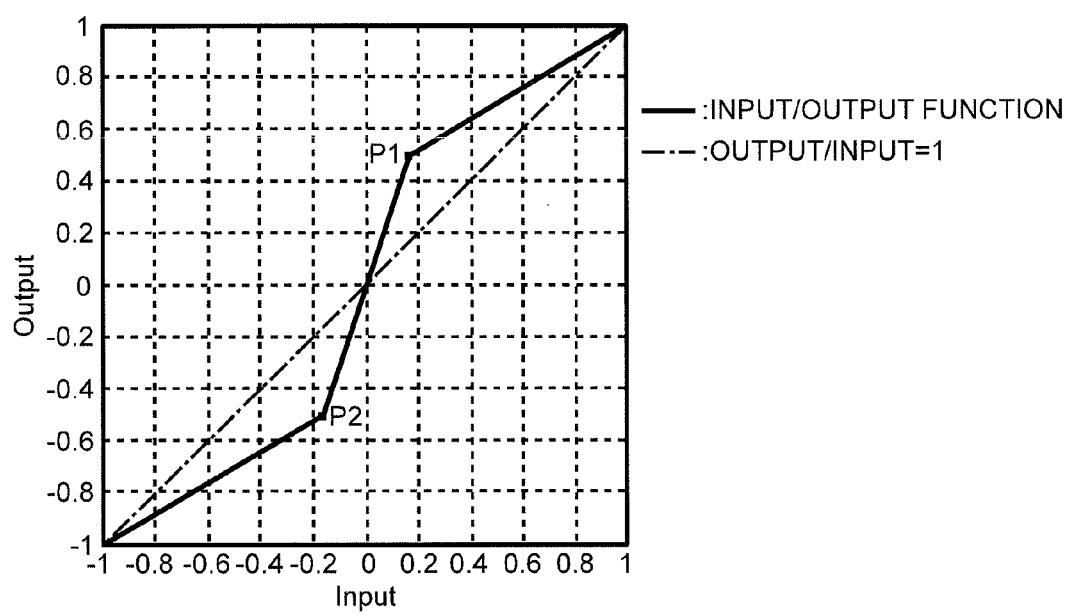
FIG. 13 shows an input/output function set to the input/output function part 38 through simulation illustrated in FIG. 12.
Figure 14A:
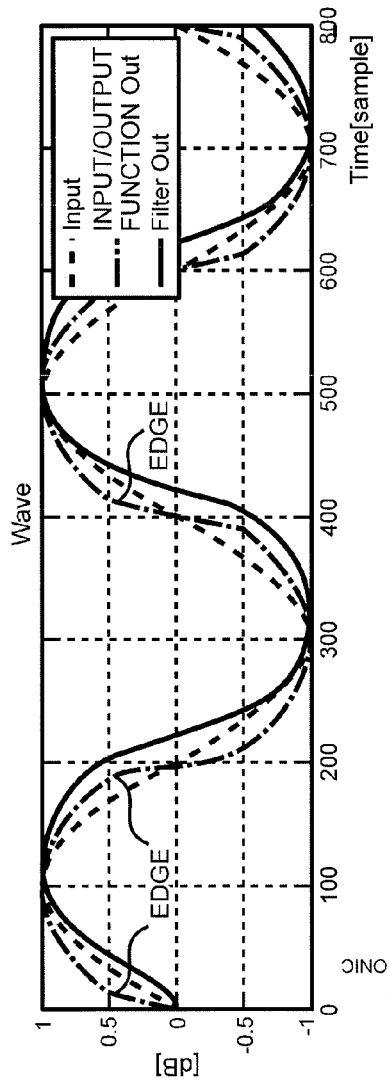
FIGS. 14(a), 14(b) and 14(c) illustrate simulation operation according to the input/output function of FIG. 13, FIG.
Figure 14B:
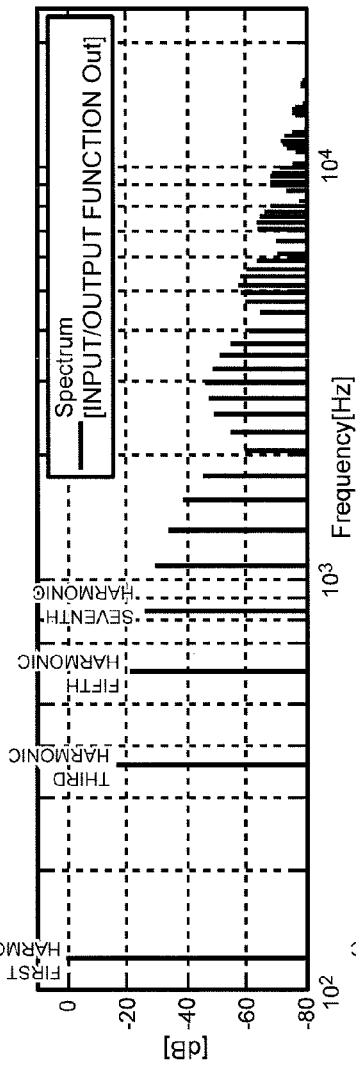
Figure 14C:
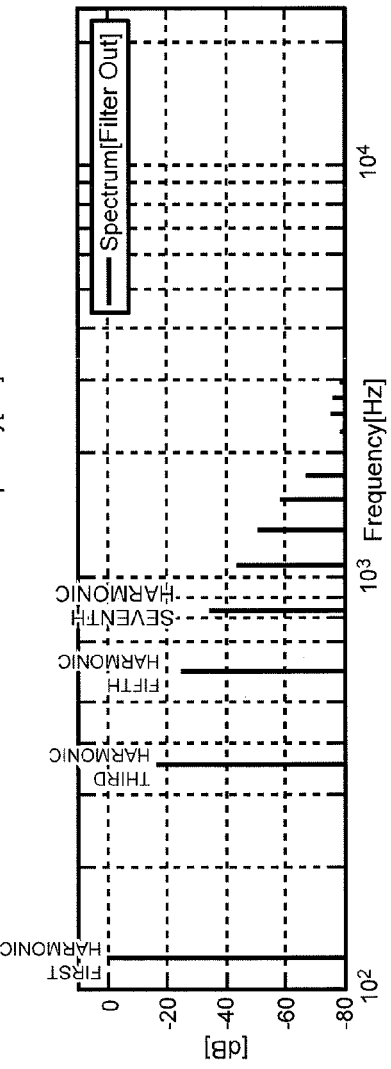

A detailed description will be given of harmonics generated by the harmonic adding system 28 (28-1 or 28-2) in consideration of the low pass filter 44 (44-1 or 44-2) of FIG. 1. As shown in FIG. 12, a 120 Hz sine-wave signal (sampling frequency=48 kHz) is used as an input signal of the input/output function part 38 (38-1 or 38-2) and the low pass filter 44 is implemented as a second-order IIR filter having a cutoff frequency of 500 Hz. An input/output function of FIG. 13 is set to the input/output function part 38. The input/output function is symmetrical about the origin (0, 0). FIG. 14(a) shows waveforms of the sine-wave signal input to the input/output function part 38, the output signal of the input/output function part 38 and the output signal of the low pass filter 44. FIG. 14(b) shows the frequency spectrum characteristics of the output signal of the input/output function part 38 and FIG. 14(c) shows the frequency spectrum characteristics of the output signal of the low pass filter 44. As represented by a chain line in FIG. 14(a), waveform edges (angles) are generated in the output signal of the input/output function part 38. Since the input/output function is symmetrical about the origin (0, 0), the output signal of the input/output function part 38 includes only odd-numbered harmonics added to a 120 Hz first or basic harmonic. The output signal includes high-order harmonics, as shown in FIG. 14(*b*). When the output signal of the input/output function part 38 passes through the low pass filter 44, the output signal of the low pass filter 44 has a smoothed waveform from which the edges have been removed, as represented by a solid line in FIG. 14(*a*), and becomes a signal in which high-order harmonics have been suppressed or removed, as shown in FIG. 14(*c*). That is, while the input/output function has a simple non-linear characteristic corresponding to three straight lines connecting four points, the same effect as that obtained when S-characteristics are used for the input/output function can be achieved by arranging the low pass filter 44 downstream of the input/output function part 38. In digital signal processing, the quantity of computations in case of generation of harmonics using a combination of an input/output function based on a polygonal line and a low pass filter is smaller than that in case of generation of harmonics using an input/output function having S-characteristics.

A description will be given of harmonics generated when an input/output function of FIG. 15 is set to the input/output function part of FIG. 12. The input/output function of FIG. 15 is asymmetrical about the origin (0, 0). FIG. 16(*a*) shows waveforms of a sine-wave signal input to the input/output function part 38, the output signal of the input/output function part 38 and the output signal of the low pass filter 44. FIG. 16(*b*) shows the frequency spectrum characteristics of the output signal of the input/output function part 38 and FIG. 16(*c*) shows the frequency spectrum characteristics of the output signal of the low pass filter 44. As represented by a chain line in FIG. 14(*a*), waveform edges (angles) are generated in the output signal of the input/output function part 38. Since the input/output function is asymmetrical about the origin (0, 0), the output signal of the input/output function part 38 includes odd-numbered harmonics and even-numbered harmonics added to a 120 Hz first harmonic. The ratio of odd-numbered harmonics to even-numbered harmonics may vary with a degree of point asymmetry. That is, the ratio of odd-numbered harmonics increases as the input/output function becomes close to point symmetry and the ratio of even-numbered harmonics increases as the input/output function becomes point asymmetry. Splendid and gentle sound is generated when the ratio of even-numbered harmonics is high. When the ratio of odd-numbered harmonics is high, metallic sound is obtained. The output signal (chain line) of the input/output function part 38, shown in FIG. 16(*a*), includes high-order harmonics, as shown in FIG. 16(*b*). When the output signal of the input/output function part 38 passes through the low pass filter 44, the output signal of the low pass filter 44 has a smoothed waveform from which the edges have been removed, as represented by a solid line in FIG. 16(*a*), and becomes a signal from which high-order harmonics have been suppressed or removed, as shown in FIG. 16(*c*). Although a DC component is generated in the output signal of the input/output function part 38 because the input/output function is asymmetrical about the origin (0, 0) (the DC component is not shown in FIGS. 16(*b*) and 16(*c*)), the DC component is cut by the DC cutoff units 42-1 and 42-2 (FIG. 1). Accordingly, inflection points can be freely determined (inflection points can be set such that the input/output function does not pass through the origin (0, 0)).

A description will be given of measures to properly generate harmonics even when an input signal level is low. When the input/output function is set to the function shown in FIG. 17 (inflection point P1 (−12 dB, −8 dB), inflection point P2 (−12 dB, −8d), if the input signal level corresponds to the inflection points P1 and P2, −12 dB (value with respect to full bit value), as represented by a broken line in FIG. 18(*a*), the input signal does not exceed the inflection points P1 and P2. Accordingly, the output signal corresponding to a gain-increased input signal is obtained, as represented by a chain line in FIG. 18(*a*) and harmonics are not generated, as shown in FIG. 18(*b*). Therefore, measures to properly generate harmonics even in the case of low input signal level are needed.

<<Low-Signal Input Measure 1>>

As shown in FIG. 19, an amplitude measurement unit 60 measures the amplitude of an input signal amplified by the amplifier 36 with a gain A. The controller 14 compares the measured amplitude with input signal levels of the inflection points P1 and P2 and moves the inflection points P1 and P2 of the input/output function set to the input/output function part 38 to control the input signal to exceed the inflection points P1 and P2. For example, if the input/output function is set to the function shown in FIG. 17 and the input signal levels correspond to the level represented by a broken line in FIG. 18(*a*), the inflection points P1 and P2 are moved in the direction of the origin, as shown in FIG. 20 to generate new inflection points P1' and P2'. In the example of FIG. 20, the inflection points P1 and P2 are moved to positions at which the input signal levels and output signal levels of the inflection points P1 and P2 are reduced by −6 dB. In this case, the input signal (broken line) of FIG. 18(*a*) passes through the inflection points. Consequently, the output signal is distorted, as represented by a chain line in FIG. 21(*a*) (broken line corresponds to the input signal waveform), and the frequency spectrum characteristics of the output signal show that the output signal include harmonics added thereto, as shown in FIG. 21(*b*). The amplitude measurement unit 60 may be configured of a peak-and-hold circuit to which an appropriate attenuation rate is set, for example. Harmonics are properly generated even when the input signal level is low by moving the inflection points P1 and P2 following the input signal level. The inflection points P1 and P2 may be moved only in the direction of the input signal level axis. However, when the inflection points P1 and P2 are moved in both the directions of the input signal level axis and output signal level axis by the same amount (by −6 dB in case of the example of FIG. 20), the pattern of the input/output function can be prevented from being considerably changed (for example, the pattern of the input/output function is remarkably changed when the inflection points are moved only in the direction of the input signal level axis and not moved in the direction of the output signal level axis), and thus variation in sound quality due to a change in the input signal level can be suppressed.

<<Low Signal Input Measure 2>>

As shown in FIG. 22, the amplifier 36 and the attenuator 40 have variable gains, and the controller 14 compares the amplitude of the input signal, measured by the amplitude measurement unit 60, with the input signal levels of the inflection points P1 and P2 and controls the gain of the amplifier 36 to automatically vary such that the input signal level of the input/output function part 38 approximates to a specific level that passes through the inflection points P1 and P2. The gain of the attenuator 40 is automatically varied to the inverse of the gain of the amplifier 36. Accordingly, the input signal (broken line) of FIG. 18(*a*) passes through the inflection points even when the signal level is low. Consequently, the output signal is distorted, as represented by a chain line in FIG. 23(*a*) (broken line corresponds to the input signal waveform), and the frequency spectrum characteristics of the output signal show that the output signal includes harmonics added thereto, as shown in FIG. 23(*b*). The amplitude measurement unit 60 may be configured of a peak-and-hold circuit to which an appropriate attenuation rate is set, as the amplitude measurement unit 60 of FIG. 19.

<<Modifications>>

While a case in which odd-numbered harmonics only or odd-numbered harmonics+even-numbered harmonics are added as harmonics in the above-described embodiments, odd-numbered harmonics alone can be added. Even-numbered harmonics are achieved by setting an input/output function corresponding to half-wave rectification shown in FIG. 24 to the input/output function part 38. This input/output function is obtained by setting the inflection point P1 to the origin (0, 0) and setting the inflection point P2 to (−1, 0). In this case, while a DC component is generated in the output signal of the input/output function part 38 because the input/output function is asymmetrical about the origin (0, 0), the DC component is cut by the DC cutoff units 42-1 and 42-2 (FIG. 1).

While the number of inflection points is 2 in the above-described embodiments, the number of inflection points is not limited thereto and may be 1 or 3. In case of a single inflection point, odd-numbered harmonics and even-numbered harmonics are generated since the input/output function is asymmetrical about the origin.

While a corresponding output signal level is sequentially calculated from the level of the input sound signal and output using a program that defines the input/output function in the above-described embodiments, an output signal level corresponding to each input signal level may be previously calculated using the program and stored as a table in a memory and, for actual operation, an output signal level corresponding to the level of an input signal may be read from the memory and output.

The present invention can be applied to sound reproduction for the following purposes, for example.

<<Enhancer>>

Reproduction circuit of a speaker included in a TV receiver: this performs low range emphasis and middle and high range balance adjustment by dividing a harmonic adding system into low range, middle range and high range, generating harmonics of source sound, and adding the harmonics to the source sound to reproduce sound. Low range emphasis uses missing fundamental phenomenon according to low-range harmonics.

Reproduction circuit for reproducing a compressed sound source through an audio speaker: this adds a high range component that is not included in source sound to the source sound and reproduces sound by dividing a harmonic adding system into middle range and high range, generating harmonics of source sound, and adding the harmonics to the source sound to reproduce sound. Low range emphasis uses missing fundamental phenomenon according to harmonics of low range.

Reproduction circuit of a speaker included in a portable terminal: this performs low range emphasis using the missing fundamental phenomenon by dividing a harmonic adding system into low range and middle range or into low range, middle range and high range, generating harmonics of source sound, and adding the harmonics to the source sound to reproduce sound. Low range emphasis uses missing fundamental phenomenon according to harmonics of low range. In addition, this performs low range emphasis and middle and high range balance adjustment.

FIG. 25 is a block diagram showing a portable terminal device 100. In the portable terminal device 100, a codec LSI 12 is connected to various units 101-103 of the portable terminal device 100, and is equipped with a digital input interface 10d, analog input interface 10a, digital output interface 18d, and analog output interface 18a. The various unit 101-103 include an application processor 101 equipped with a memory 104, a wireless module 102 and a communication processor 103 equipped with a cellular transmitter/receiver 105 transmitting and receiving a wireless signal for telephonic communication.

The application processor 101 expands and reproduces compressed audio data stored in the memory 104. Further, the application processor 101 compresses input audio data and stores the compressed input audio data in the memory 104. Moreover, the application processor 101 can expand and reproduce MIDI data and also can compress and store MIDI data. The wireless module 102 is provided for near distance wireless communication such as Bluetooth and used for hands free communication by income. The communication processor 103 provides telephonic function by acquiring a sound signal from the wireless signal.

The codec LSI 12 is provided with a mixer/selector 111, ADC 112, DAC 113 and DSP 114. The mixer/selector 111 mixes all kinds of input digital audio data in free manner and selectively outputs mixed audio data to DSP 114, DAC 113 and so on. The DSP 114 includes a harmonic adding unit 16 configured according to the invention. The harmonic adding unit 16 can treat all of the digital audio data fed from the mixer/selector 111, and returns the audio data treated by the harmonic adding unit 16 to the mixer/selector 111. The DSP 114 performs other signal processing 115 such as noise suppressing, auto gain control and equalizing of the audio signal fed from the mixer/selector.

As described above, in the portable terminal device 100, the transmitter/receiver 105 is configured to transmit and receive a wireless signal. The communication processor 103 is configured to acquire a digital sound signal from the wireless signal received by the transmitter/receiver 105. The codec LSI 12 is configured to process the digital sound signal fed from the communication processor 103. The codec LSI 12 is composed of the interface 10d and 18d configured to input and output the digital sound signal, and the digital signal processor DSP) 114 configured to perform various processing of the digital sound signal. The digital signal processor 114 includes the harmonic adding unit 16 configured as shown in FIG. 1 according to the present invention.

What is claimed is:

1. A harmonic adding device comprising:
an input/output function part that is set with an input/output function determining relationship between an input signal level and an output signal level, the input/output function part receiving a digital sound signal having an input signal level, converting the received digital sound signal into a digital sound signal having an output signal level determined according to the input/output function and the input signal level of the received digital sound signal, and outputting the converted digital sound signal having the determined output signal level;
a parameter storage unit that is configured to store at least one inflection point set to the input/output function for enabling the input/output function part to add harmonics to the received digital sound signal; and
a controller that is configured to set the inflection point stored in the parameter storage unit to the input/output function of the input/output function part,
wherein the input/output function has the relationship between a positive maximum point at which the output signal level represents a first positive maximum value when the input signal level corresponds to a second positive maximum value and a negative maximum point at which the output signal level represents a first negative maximum value when the input signal level corresponds to a second negative maximum value, the inflection point is set between the positive maximum point and the negative maximum point, and the positive maximum point, the inflection point and the negative maximum point are sequentially connected by linear interpolation to formulate the input/output function.

2. The harmonic adding device of claim 1, wherein the parameter storage unit stores the inflection point in the form of a pair of a value of the input signal level and a value of the output signal level corresponding to the input signal level.

3. The harmonic adding device of claim 1, wherein the input/output function part sequentially calculates the output signal level from the input signal level of the received digital sound signal using a program defining the input/output function, and outputs the digital sound signal having the calculated output signal level.

4. The harmonic adding device of claim 1, further comprising:
- a plurality of systems configured to process the received digital sound signal in parallel to each other, the plurality of systems including a harmonic adding system and a dry system, the harmonic adding system containing the input/output function part being capable of adding harmonics to the received digital sound signal, the dry system excluding the input/output function part and being unable to add harmonics to the received digital sound signal; and
- an adder configured to sum a digital sound signal having passed through the harmonic adding system and a digital sound signal having passed through the dry system.

5. The harmonic adding device of claim 1, further comprising:
- a band dividing filter configured to divide the received digital sound signal into a plurality of frequency band components; and
- a plurality of systems provided in correspondence to the plurality of the frequency band components for processing the plurality of the frequency band components in parallel to each other, each system including the input/output function part being capable of adding harmonics to the corresponding frequency band component of the received digital sound signal,
- wherein the parameter storage unit stores at least one inflection point for each system, and the controller sets the inflection point stored in the parameter storage unit to the input/output function of the input/output function part contained in each system.

6. The harmonic adding device of claim 1, wherein the parameter storage unit stores a first inflection point specified by a value of the input signal level in the range of 0 to the second positive maximum value and a value of the output signal level in the range of 0 to the first positive maximum value, and stores a second inflection point specified by a value of the input signal level in the range of 0 to the second negative maximum value and a value of the output signal level in the range of 0 to the first negative maximum value, and
- the controller sets the first inflection point and the second inflection point to the input/output function so that the positive maximum point, the first inflection point, the second inflection point and the negative maximum point are sequentially connected by linear interpolation to formulate the input/output function.

7. The harmonic adding device of claim 1, further comprising a DC cutoff part configured to cut a DC component contained in the converted digital sound signal.

8. The harmonic adding device of claim 1, further comprising an amplitude measurement unit configured to measure an amplitude of the received digital sound signal,
- wherein when the measured amplitude of the received digital sound signal is low, the controller shifts the inflection point to a low range lower than a range in which the inflection point is set when the measured amplitude is high, and
- whereby the input/output function part can add harmonics to the received digital sound signal even when the measured amplitude thereof is low.

9. The harmonic adding device of claim 1, further comprising:
- an amplitude measurement unit configured to measure an amplitude of the received digital sound signal;
- an amplifier configured to amplify the received digital sound signal with a variable gain and to input the amplified digital sound signal to the input/output function part; and
- an attenuator configured to attenuate the converted digital sound signal with a variable gain corresponding to an inverse number of the variable gain of the amplifier,
- wherein when the measured amplitude of the received digital sound signal is low, the controller increases the variable gain of the amplifier as compared to the variable gain of the amplifier when the measured amplitude is high, and
- whereby the input/output function part can add harmonics to the received digital sound signal even when the measured amplitude thereof is low.

10. The harmonic adding device of claim 1, further comprising:
- a low pass filter that is configured to suppress or remove a harmonic component having a frequency higher than a predetermined frequency and being contained in the converted digital sound signal.

11. A codec LSI comprising:
- an interface configured to input a digital sound signal and output a digital sound signal; and
- a digital signal processor configured to perform various processing of the inputted digital sound signal,
- wherein the digital signal processor includes a harmonic adding unit comprising:
  - an input/output function part that is set with an input/output function determining relationship between an input signal level and an output signal level, the input/output function part converting the inputted digital sound signal or a processed digital sound signal by the digital signal processor into a digital sound signal having an output signal level determined according to the input/output function and an input signal level of the inputted digital sound signal or the processed digital sound signal;
  - a parameter storage unit that is configured to store at least one inflection point set to the input/output function for enabling the input/output function part to add harmonics to the inputted digital sound signal or the processed digital sound signal; and
  - a controller that is configured to set the inflection point stored in the parameter storage unit to the input/output function of the input/output function part,
  - wherein the input/output function has the relationship between a positive maximum point at which the output signal level represents a positive maximum value when the input signal level corresponds to a positive maximum value and a negative maximum point at which the output signal level represents a negative maximum value when the input signal level corresponds to a negative maximum value, the inflection point is set between the positive maximum point and the negative maximum point, and the positive maximum point, the inflection point and the negative maximum point are sequentially connected by linear interpolation to formulate the input/output function.

12. A portable terminal device comprising:

a transmitter/receiver configured to transmit a wireless signal and receive a wireless signal;

a communication processor configured to acquire a digital sound signal from the wireless signal received by the transmitter/receiver; and a codec LSI configured to process the digital sound signal fed from the communication processor, wherein the codec LSI comprises:

an interface configured to input the digital sound signal and output a digital sound signal; and a digital signal processor configured to perform various processing of the inputted digital sound signal, wherein the digital signal processor includes a harmonic adding unit comprises:

an input/output function part that is set with an input/output function determining relationship between an input signal level and an output signal level, the input/output function part converting the inputted digital sound signal or a processed digital sound signal by the digital signal processor into a digital sound signal having an output signal level determined according to the input/output function and an input signal level of the inputted digital sound signal or the processed digital sound signal;

a parameter storage unit that is configured to store at least one inflection point set to the input/output function for enabling the input/output function part to add harmonics to the inputted digital sound signal or the processed digital sound signal; and a controller that is configured to set the inflection point stored in the parameter storage unit to the input/output function of the input/output function part, wherein the input/output function has the relationship between a positive maximum point at which the output signal level represents a positive maximum value when the input signal level corresponds to a positive maximum value and a negative maximum point at which the output signal level represents a negative maximum value when the input signal level corresponds to a negative maximum value, the inflection point is set between the positive maximum point and the negative maximum point, and the positive maximum point, the inflection point and the negative maximum point are sequentially connected by linear interpolation to set the input/output function.

* * * * *